United States Patent
Nishizawa et al.

(10) Patent No.: US 9,874,484 B2
(45) Date of Patent: Jan. 23, 2018

(54) PHYSICAL QUANTITY DETECTING DEVICE, ELECTRONIC APPARATUS, AND MOVING OBJECT

(71) Applicant: Seiko Epson Corporation, Tokyo (JP)

(72) Inventors: Ryuta Nishizawa, Matsumoto (JP); Keiji Nakagawa, Minowa (JP); Keiichi Yamaguchi, Ina (JP); Atsushi Matsuo, Okaya (JP); Fumio Ichikawa, Suwa (JP)

(73) Assignee: Seiko Epson Corporation (JP)

( * ) Notice: Subject to any disclaimer, the term of this patent is extended or adjusted under 35 U.S.C. 154(b) by 479 days.

(21) Appl. No.: 14/665,293

(22) Filed: Mar. 23, 2015

(65) Prior Publication Data

US 2015/0268107 A1  Sep. 24, 2015

(30) Foreign Application Priority Data

Mar. 24, 2014 (JP) ................ 2014-060375

(51) Int. Cl.
- *H01L 41/107* (2006.01)
- *G01L 1/16* (2006.01)
- *G01L 1/10* (2006.01)
- *H01L 41/09* (2006.01)

(52) U.S. Cl.
CPC .............. *G01L 1/162* (2013.01); *G01L 1/106* (2013.01); *H01L 41/094* (2013.01)

(58) Field of Classification Search
CPC ........ G01L 1/106; G01L 1/162; H01L 41/107
USPC .................. 310/316.01, 317, 318, 319, 338; 73/503–514.39
See application file for complete search history.

(56) References Cited

U.S. PATENT DOCUMENTS

| | | | |
|---|---|---|---|
| 5,998,911 A | 12/1999 | Kikuchi et al. | |
| 6,253,613 B1 | 7/2001 | Yachi et al. | |
| 2013/0283910 A1 | 10/2013 | Nishizawa et al. | |
| 2015/0276404 A1* | 10/2015 | Nishizawa | G01C 19/5642 73/504.12 |

FOREIGN PATENT DOCUMENTS

| | | |
|---|---|---|
| JP | 11-072334 A | 3/1999 |
| JP | 11-230758 A | 8/1999 |
| JP | 2002-340559 A | 11/2002 |
| JP | 2004-144761 A | 5/2004 |
| JP | 2010-054404 A | 3/2010 |
| JP | 2010-256332 A | 11/2010 |
| JP | 2011-017581 A | 1/2011 |
| JP | 2012-231209 A | 11/2012 |
| JP | 2013-019834 A | 1/2013 |
| JP | 2013-231635 A | 11/2013 |

* cited by examiner

*Primary Examiner* — Thomas Dougherty
(74) *Attorney, Agent, or Firm* — Harness, Dickey & Pierce, P.L.C.

(57) ABSTRACT

A physical quantity detecting device includes a vibrating element and a charge amplifier. The vibrating element includes a first detection electrode, a second detection electrode, a third detection electrode, and a fourth detection electrode. The first and fourth detection electrodes have the same electrical polarity, the second and third detection electrodes have the same electrical polarity, and the first and second detection electrodes have opposite electrical polarities. The first and fourth detection electrodes are connected to the charge amplifier, and the second and third detection electrodes are connected to the charge amplifier.

19 Claims, 21 Drawing Sheets

FIG. 6A  SIGNAL OF TERMINAL PORTION 60a (FIRST DETECTION SIGNAL)
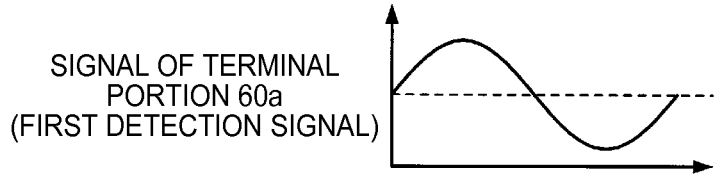
FIG. 6B  SIGNAL OF TERMINAL PORTION 62a (SECOND DETECTION SIGNAL)
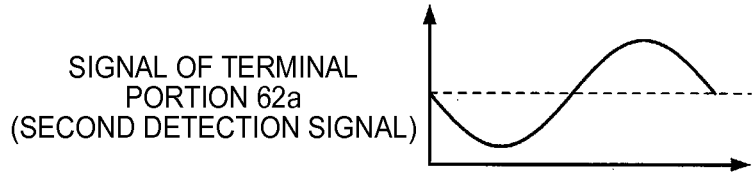
FIG. 6C  SIGNAL OF TERMINAL PORTION 64a (THIRD DETECTION SIGNAL)
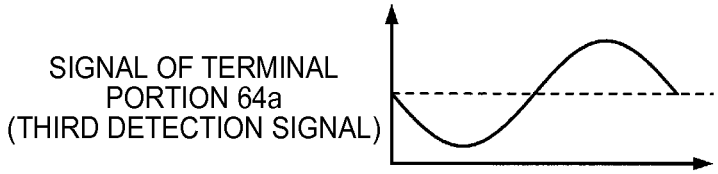
FIG. 6D  SIGNAL OF TERMINAL PORTION 66a (FOURTH DETECTION SIGNAL)
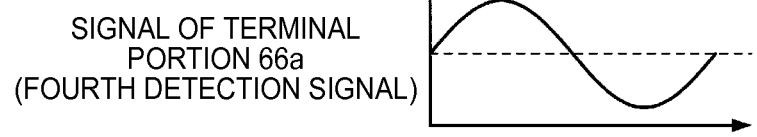
FIG. 6E  INPUT SIGNAL OF CHARGE AMPLIFIER 451
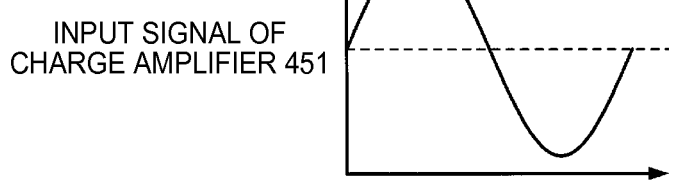
FIG. 6F  INPUT SIGNAL OF CHARGE AMPLIFIER 452
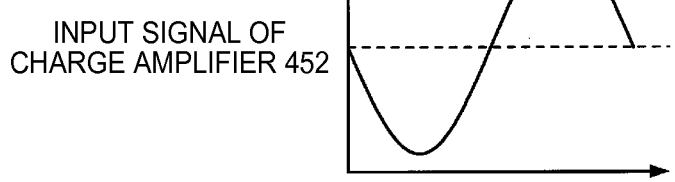

PHYSICAL QUANTITY DETECTING DEVICE, ELECTRONIC APPARATUS, AND MOVING OBJECT

BACKGROUND

1. Technical Field

The present invention relates to a physical quantity detecting device, an electronic apparatus, and a moving object.

2. Related Art

A physical quantity detecting device that detects a physical quantity, such as an angular velocity or acceleration, using a vibrating element, such as a crystal oscillator (piezoelectric vibrator) or Micro Electro Mechanical Systems (MEMS) oscillator, is known.

For example, as an angular velocity detecting device for detecting the rotational angular velocity of the rotating system, a vibrating gyro sensor using a piezoelectric element, such as a crystal oscillator, is built into various electronic apparatuses, and is used for car navigation, hand shake detection at the time of imaging, and the like.

For example, a vibrating gyro sensor disclosed in JP-A-11-72334 or JP-A-2010-54404 has been proposed.

However, in a known physical quantity detecting device, such as the vibrating gyro sensor disclosed in JP-A-11-72334 or JP-A-2010-54404, some of a plurality of detection electrodes provided in a vibrating element are grounded, and optimal connection between the vibrating element and the detection circuit to increase detection sensitivity has hardly been considered. Since a change in charge (electric potential) due to the piezoelectric phenomenon occurs near the interface between the crystal and the electrode, charge corresponding to the angular velocity may also be detected from the electrode that is grounded in the related art. From the result of the experiment, it could be seen that the charge was also obtained from the electrode grounded in the related art.

SUMMARY

An advantage of some aspects of the invention is to provide a physical quantity detecting device capable of improving detection sensitivity compared with a related art device by studying the connection between a vibrating element and a detection circuit and an electronic apparatus and a moving object using the physical quantity detecting device.

The invention can be implemented as the following forms or application examples.

Application Example 1

A physical quantity detecting device according to this application example includes: a physical quantity detecting element; a first current-voltage conversion unit; and a second current-voltage conversion unit. The physical quantity detecting element includes: a base; a plurality of vibrating arms connected to the base; and a first detection electrode, a second detection electrode, a third detection electrode, and a fourth detection electrode that are provided in any of the plurality of vibrating arms and generate a first detection signal, a second detection signal, a third detection signal, and a fourth detection signal corresponding to vibrations of the vibrating arms. The first and fourth detection signals have the same electrical polarity, the second and third detection signals have the same electrical polarity, and the first and second detection signals have opposite electrical polarities. The first and fourth detection electrodes are connected to the first current-voltage conversion unit, and the second and third detection electrodes are connected to the second current-voltage conversion unit.

The first and second current-voltage conversion units may convert a current into a voltage, or may convert a charge into a voltage.

In the physical quantity detecting device according to the application example, focus is given to the fact that, when the vibrating arm vibrates to bend, a place where the electrical polarity is positive and a place where the electrical polarity is negative according to the bending state are always present. Therefore, first and fourth electrodes are provided at two places of the same electrical polarity when the vibrating arm vibrates, and second and third electrodes are provided at two other places of the opposite electrical polarity to the electrical polarity of the two places when the vibrating arm vibrates. The first detection signal generated in the first detection electrode and the fourth detection signal generated in the fourth detection electrode are converted into a voltage signal based on amplitude addition by the first current-voltage conversion unit, and the second detection signal generated in the second detection electrode and the third detection signal generated in the third detection electrode are converted into a voltage signal based on amplitude addition by the second current-voltage conversion unit.

Therefore, in the physical quantity detecting device according to the application example, compared with a known physical quantity detecting device in which the second and fourth detection electrodes are grounded, the output voltage of the first current-voltage conversion unit or the output voltage of the second current-voltage conversion unit is high. Accordingly, it is possible to improve detection sensitivity. As a result, it is possible to realize a physical quantity detecting device with a high S/N.

Application Example 2

In the physical quantity detecting device according to the application example described above, a piezoelectric member may be provided between the first and second detection electrodes, and a piezoelectric member may be provided between the third and fourth detection electrodes.

In the physical quantity detecting device according to this application example, when the piezoelectric member expands and contracts, places of opposite electrical polarities are always present. Therefore, by providing the first detection electrode, the second detection electrode, the third detection electrode, and the fourth detection electrode at appropriate places of the piezoelectric member, the first and fourth detection signals can be made to have the same electrical polarity, the second and third detection signals can be made to have the same electrical polarity, and the first and second detection signals can be made to have opposite electrical polarities.

Application Example 3

In the physical quantity detecting device according to the application example described above, the physical quantity detecting element may include a driving electrode and a fixed potential wiring line, and the driving electrode may be provided in any of the plurality of vibrating arms, and a signal to vibrate the vibrating arms may be input to the driving electrode, and the fixed potential wiring line may be provided between the driving electrode and each of the first detection electrode, the second detection electrode, the third detection electrode, and the fourth detection electrode, and a fixed electric potential may be input to the fixed potential wiring line.

In the related art, the second and fourth detection electrodes that are grounded have a shielding effect with respect to the driving electrode. In the physical quantity detecting device according to this application example, however, the second and fourth detection electrodes are not grounded. Therefore, by providing a fixed potential wiring line between the driving electrode and each of the first detection electrode, the second detection electrode, the third detection electrode, and the fourth detection electrode, electrostatic crosstalk (electrostatic coupling) through the parasitic capacitance caused between the driving electrode and each of the first detection electrode, the second detection electrode, the third detection electrode, and the fourth detection electrode is reduced. Thus, according to this application example, since noise due to the driving signal being mixed in the detection signal is reduced by a reduction in the electrostatic coupling, it is possible to realize a physical quantity detecting device with a high S/N.

Application Example 4

In the physical quantity detecting device according to the application example described above, the first and second detection electrodes may be provided in the one vibrating arm, and the third and fourth detection electrodes may be provided in the other one vibrating arm.

In the physical quantity detecting device according to this application example, when two vibrating arms vibrate to expand and contract, places of opposite electrical polarities are always present in the vibrating arms. Therefore, by providing the first and second detection electrodes in appropriate places of one of the vibrating arms and providing the third and fourth detection electrodes in appropriate places of the other vibrating arm, the first and fourth detection signals can be made to have the same electrical polarity, the second and third detection signals can be made to have the same electrical polarity, and the first and second detection signals can be made to have opposite electrical polarities.

Application Example 5

In the physical quantity detecting device according to the application example described above, the first detection electrode, the second detection electrode, the third detection electrode, and the fourth detection electrode may be provided in the one vibrating arm.

In the physical quantity detecting device according to this application example, when the vibrating arm vibrates to expand and contract, places of opposite electrical polarities are always present. Therefore, by providing the first detection electrode, the second detection electrode, the third detection electrode, and the fourth detection electrode at appropriate places of the vibrating arm, the first and fourth detection signals can be made to have the same electrical polarity, the second and third detection signals can be made to have the same electrical polarity, and the first and second detection signals can be made to have opposite electrical polarities.

Application Example 6

In the physical quantity detecting device according to the application example described above, the physical quantity detecting element may include first and second connecting arms extending in opposite directions along a first axis from the base, a first driving vibration arm that is the first vibrating arm and a second driving vibration arm that is the second vibrating arm may extend in opposite directions along a second axis perpendicular to the first axis from the first connecting arm, a third driving vibration arm that is the third vibrating arm and a fourth driving vibration arm that is the fourth vibrating arm may extend in opposite directions along the second axis from the second connecting arm, a first detection vibration arm that is the fifth vibrating arm and a second detection vibration arm that is the sixth vibrating arm may extend in opposite directions along the second axis from the base, and the first and second detection electrodes may be provided in the first detection vibration arm, and the third and fourth detection electrodes may be provided in the second detection vibration arm.

The physical quantity detecting device according to this application example includes a vibrating element having a planar shape of a double T shape. By using such a vibrating element, it is also possible to improve detection sensitivity and improve the S/N.

Application Example 7

In the physical quantity detecting device according to the application example described above, a first driving vibration arm that is the first vibrating arm and a second driving vibration arm that is the second vibrating arm may be disposed side by side along a first axis and extend along a second axis perpendicular to the first axis from the base, a first detection vibration arm that is the third vibrating arm and a second detection vibration arm that is the fourth vibrating arm may be disposed side by side along the first axis and extend in an opposite direction to the extension direction of the first and second driving vibration arms from the base, and the first and second detection electrodes may be provided in the first detection vibration arm, and the third and fourth detection electrodes may be provided in the second detection vibration arm.

The physical quantity detecting device according to this application example includes a vibrating element having a planar shape of an H shape. By using such a vibrating element, it is also possible to improve detection sensitivity and improve the S/N.

Application Example 8

In the physical quantity detecting device according to the application example described above, in the physical quantity detecting element, a first driving vibration arm that is the first vibrating arm, a second driving vibration arm that is the second vibrating arm, and a detection vibration arm that is the third vibrating arm may be disposed side by side along a first axis and extend along a second axis perpendicular to the first axis from the base, and the first detection electrode, the second detection electrode, the third detection electrode, and the fourth detection electrode may be provided in the detection vibration arm.

The physical quantity detecting device according to this application example includes a tripod type vibrating element. By using such a vibrating element, it is also possible to improve detection sensitivity and improve the S/N.

Application Example 9

In the physical quantity detecting device according to the application example described above, in the physical quantity detecting element, a first driving detection vibration arm that is the first vibrating arm and a second driving detection vibration arm that is the second vibrating arm may be disposed side by side along a first axis and extend along a second axis perpendicular to the first axis from the base, the second detection electrode may be provided in the first driving detection vibration arm, and the fourth detection electrode may be provided in the second driving detection vibration arm, and a piezoelectric film may be provided between the first and second detection electrodes, and a piezoelectric film may be provided between the third and fourth detection electrodes.

In the physical quantity detecting device according to this application example, even if the vibrating element itself does not have a piezoelectric property, desired first to fourth detection signals are obtained by deformation of the piezoelectric film due to vibration of the driving detection vibration arm. Therefore, it is possible to improve detection sensitivity and improve the S/N.

Application Example 10

An electronic apparatus according to this application example includes any one of the physical quantity detecting devices according to the application examples described above.

Application Example 11

A moving object according to this application example includes any one of the physical quantity detecting devices according to the application examples described above.

Since the electronic apparatus and the moving object according to these application examples include the physical quantity detecting device with improved detection sensitivity compared with the related art, it is possible to realize a more reliable electronic apparatus and a more reliable moving object.

BRIEF DESCRIPTION OF THE DRAWINGS

The invention will be described with reference to the accompanying drawings, wherein like numbers reference like elements.

FIGS. 6A to 6F are diagrams showing examples of the signal waveform in the detection mode.

DESCRIPTION OF EXEMPLARY EMBODIMENTS

Hereinafter, preferred embodiments of the invention will be described in detail with reference to the accompanying diagrams. In addition, the embodiments described below are not intended to limit the contents of the invention defined by the appended claims. In addition, all of the configurations described below are not necessarily essential components of the invention.

Hereinafter, a physical quantity detecting device that detects an angular velocity as a physical quantity will be described as an example. However, a physical quantity detecting device that detects a physical quantity other than the angular velocity is also included in the invention.

1. Physical Quantity Detecting Device 1-1. First Embodiment

Functional Configuration of a Physical Quantity Detecting Device

Figure 1:
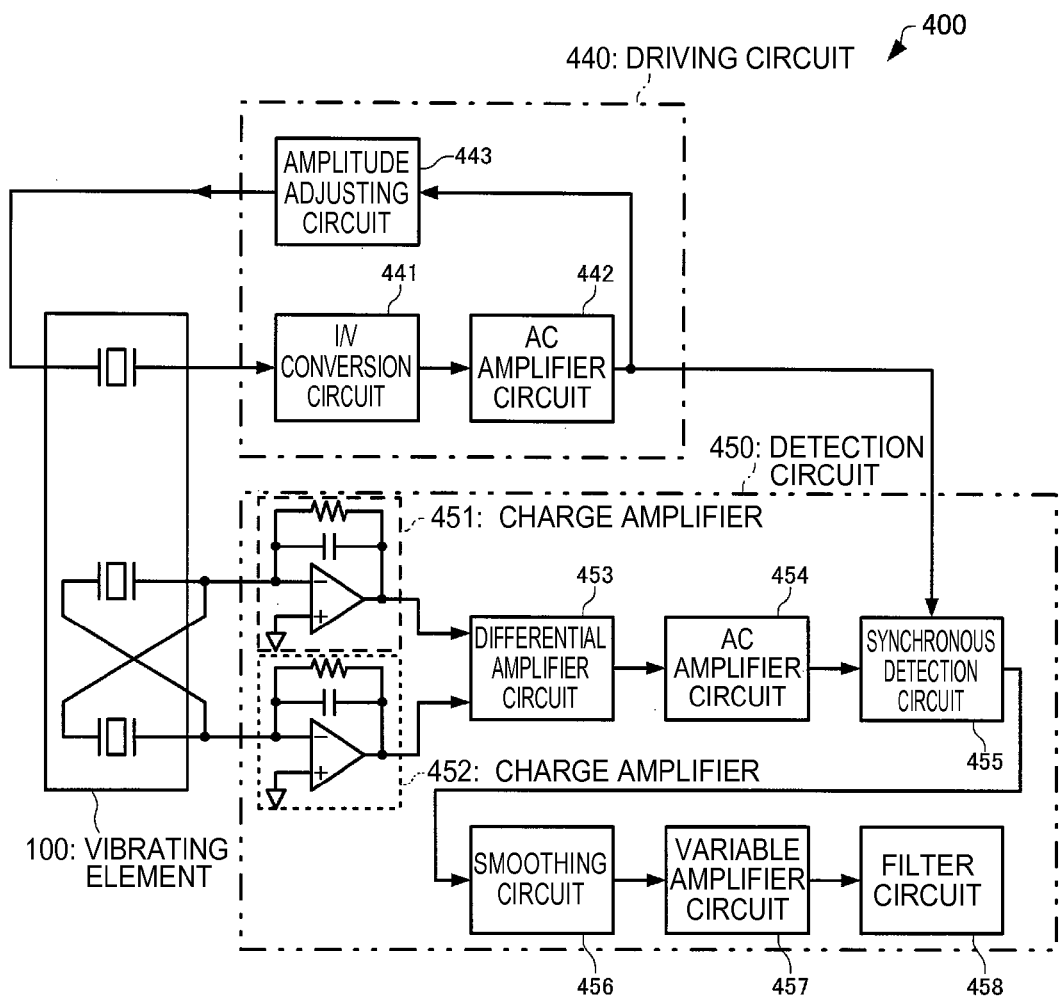
FIG. 1 is a diagram showing an example of the configuration of a physical quantity detecting device according to a first embodiment.

FIG. 1 is a functional block diagram of a physical quantity detecting device according to a first embodiment. As shown in FIG. 1, a physical quantity detecting device 400 according to the present embodiment includes a vibrating element 100, a driving circuit 440 for driving and vibrating driving vibration arms 220, 222, 224, and 226 (refer to FIGS. 2 and 3) of the vibrating element 100, and a detection circuit 450 for detecting detection vibration occurring in detection vibration arms 230 and 232 of the vibrating element 100 when an angular velocity (an example of a physical quantity) is applied. The driving circuit 440 and the detection circuit 450 may be realized by one chip, or may be realized by separate IC chips.

The driving circuit 440 includes an I/V conversion circuit (current-voltage conversion circuit) 441, an AC amplifier circuit 442, and an amplitude adjusting circuit 443. The driving circuit 440 is a circuit which outputs a signal for driving the driving vibration arms 220, 222, 224, and 226 to a driving input electrode 30 (refer to FIGS. 2 and 3) of the vibrating element 100 and to which a signal output from a driving output electrode 32 (refer to FIGS. 2 and 3) of the vibrating element 100 is input. Hereinafter, the driving circuit 440 will be described in detail.

When the driving vibration arms 220, 222, 224, and 226 of the vibrating element 100 vibrate, AC current based on the piezoelectric effect is output from the driving output electrode 32, and is input to an I/V conversion circuit 441. The I/V conversion circuit 441 converts the input AC current into an AC voltage signal having the same frequency as the vibration frequency of the driving vibration arms 220, 222, 224, and 226, and outputs the AC voltage signal.

The AC voltage signal output from the I/V conversion circuit 441 is input to the AC amplifier circuit 442. The AC amplifier circuit 442 amplifies and outputs the input AC voltage signal.

The AC voltage signal output from the AC amplifier circuit 442 is input to the amplitude adjusting circuit 443. The amplitude adjusting circuit 443 controls a gain so as to maintain the amplitude of the input AC voltage signal at a fixed value, and outputs an AC voltage signal after the gain control to the driving input electrode 30 of the vibrating element 100. The driving vibration arms 220, 222, 224, and 226 are vibrated by the AC voltage signal (driving signal) input to the driving input electrode 30.

The detection circuit 450 has a charge amplifier 451, a charge amplifier 452, a differential amplifier circuit 453, an AC amplifier circuit 454, a synchronous detection circuit 455, a smoothing circuit 456, a variable amplifier circuit 457, and a filter circuit 458. The detection circuit 450 is a circuit that detects an angular velocity based on a signal output from each of a first detection electrode 40, a second detection electrode 42, a third detection electrode 44, and a fourth detection electrode 46 (refer to FIGS. 2 and 3) of the vibrating element 100. Hereinafter, the detection circuit 450 will be described in detail.

The charge amplifier 451 (first current-voltage conversion unit) is configured to include an operational amplifier, a feedback resistor, and a feedback capacitor. A first detection signal (AC current) output from the first detection electrode 40 and a fourth detection signal (AC current) output from the fourth detection electrode 46 are input to the inverting input terminal (− terminal) of the operational amplifier, and the non-inverting input terminal (+ terminal) of the operational amplifier is fixed to the reference potential. As will be described later, the first and fourth detection signals have the same electrical polarity, and the charge amplifier 451 converts the first detection signal (AC current) and the fourth detection signal (AC current) input to the operational amplifier into AC voltage signals.

The charge amplifier 452 (second current-voltage conversion unit) is configured to include an operational amplifier, a feedback resistor, and a feedback capacitor. A second detection signal (AC current) output from the second detection electrode 42 and a third detection signal (AC current) output from the third detection electrode 44 are input to the inverting input terminal (− terminal) of the operational amplifier, and the non-inverting input terminal (+ terminal) of the operational amplifier is fixed to the reference potential. As will be described later, the second and third detection signals have the same electrical polarity, and the charge amplifier 452 converts the second detection signal (AC current) and the third detection signal (AC current) input to the operational amplifier into AC voltage signals.

In addition, the electrical characteristics of the first and fourth detection signals are opposite to the electrical characteristics of the second and third detection signals.

The output signal of the charge amplifier 451 and the output signal of the charge amplifier 452 are input to the differential amplifier circuit 453.

The differential amplifier circuit 453 functions as a differential amplifier that differentially amplifies the output signal of the vibrating element 100, and outputs a signal obtained by amplifying (differentially amplifying) the potential difference between the output signal of the charge amplifier 451 and the output signal of the charge amplifier 452. The output signal of the differential amplifier circuit 453 is input to the AC amplifier circuit 454.

The AC amplifier circuit 454 functions as an AC amplifier that amplifies an AC signal, and outputs a signal obtained by amplifying the output signal of the differential amplifier circuit 453. The output signal of the AC amplifier circuit 454 is input to the synchronous detection circuit 455.

The synchronous detection circuit 455 extracts an angular velocity component by performing synchronous detection of the output signal of the AC amplifier circuit 454 based on the AC voltage signal output from the AC amplifier circuit 442 of the drive circuit 440.

The signal of the angular velocity component extracted by the synchronous detection circuit 455 is smoothed to become a DC voltage signal by the smoothing circuit 456, and the DC voltage signal is input to the variable amplifier circuit 457.

The variable amplifier circuit 457 changes angular velocity sensitivity by amplifying (or attenuating) the output signal (DC voltage signal) of the smoothing circuit 456 with a set gain (or an attenuation rate). The signal amplified (or attenuated) by the variable amplifier circuit 457 is input to the filter circuit 458.

The filter circuit 458 removes a high-frequency noise component outside the sensor bandwidth from the output signal of the variable amplifier circuit 457 (more accurately, attenuates the output signal of the variable amplifier circuit 457 to a predetermined level or lower), and outputs a detection signal having a polarity and a voltage level corresponding to the direction and size of the angular velocity. Then, the detection signal is output from an external output terminal (not shown) to the outside.

Configuration of a Vibrating Element

Figure 2:
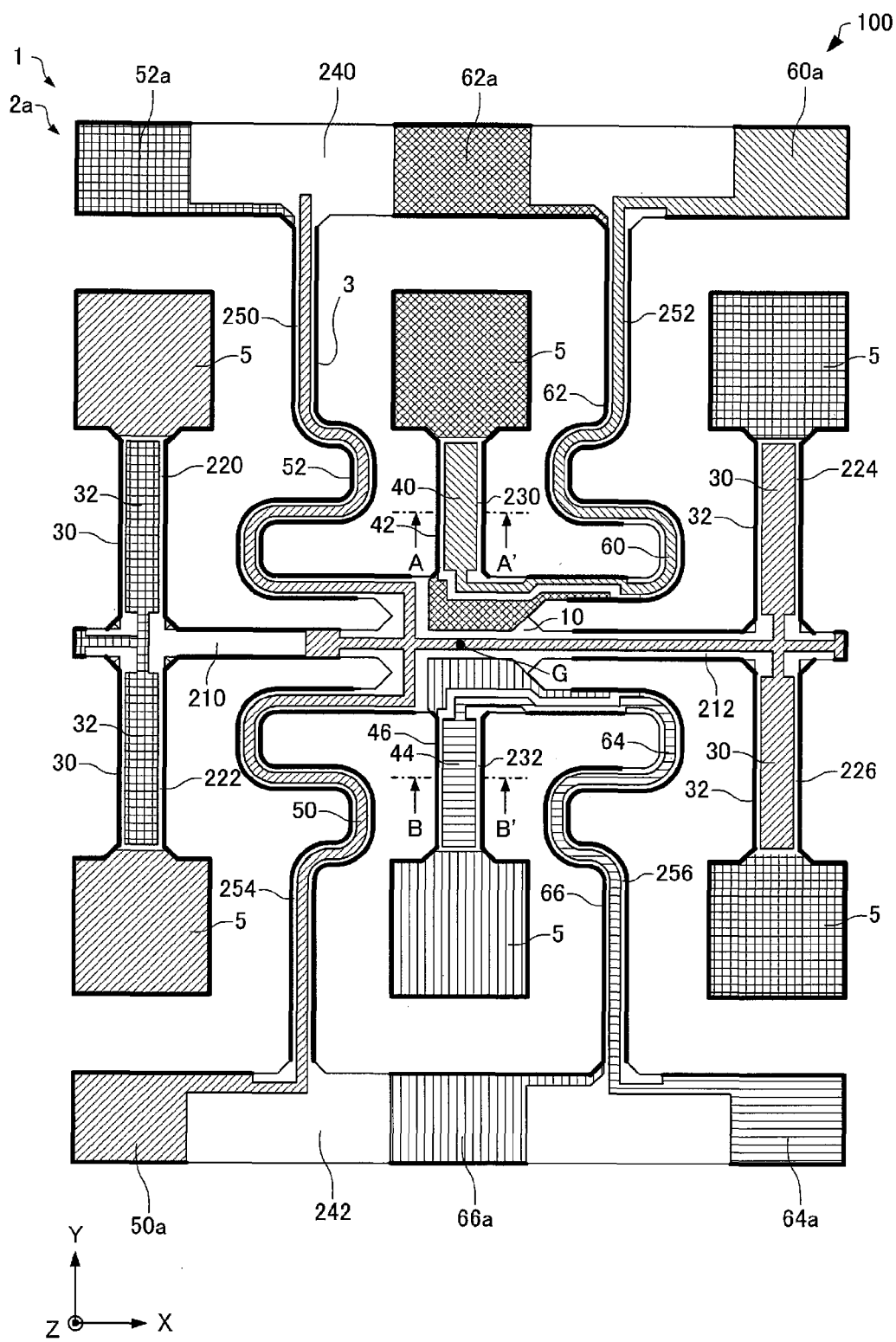
FIG. 2 is a plan view schematically showing a vibrating element according to the first embodiment.
Figure 3:
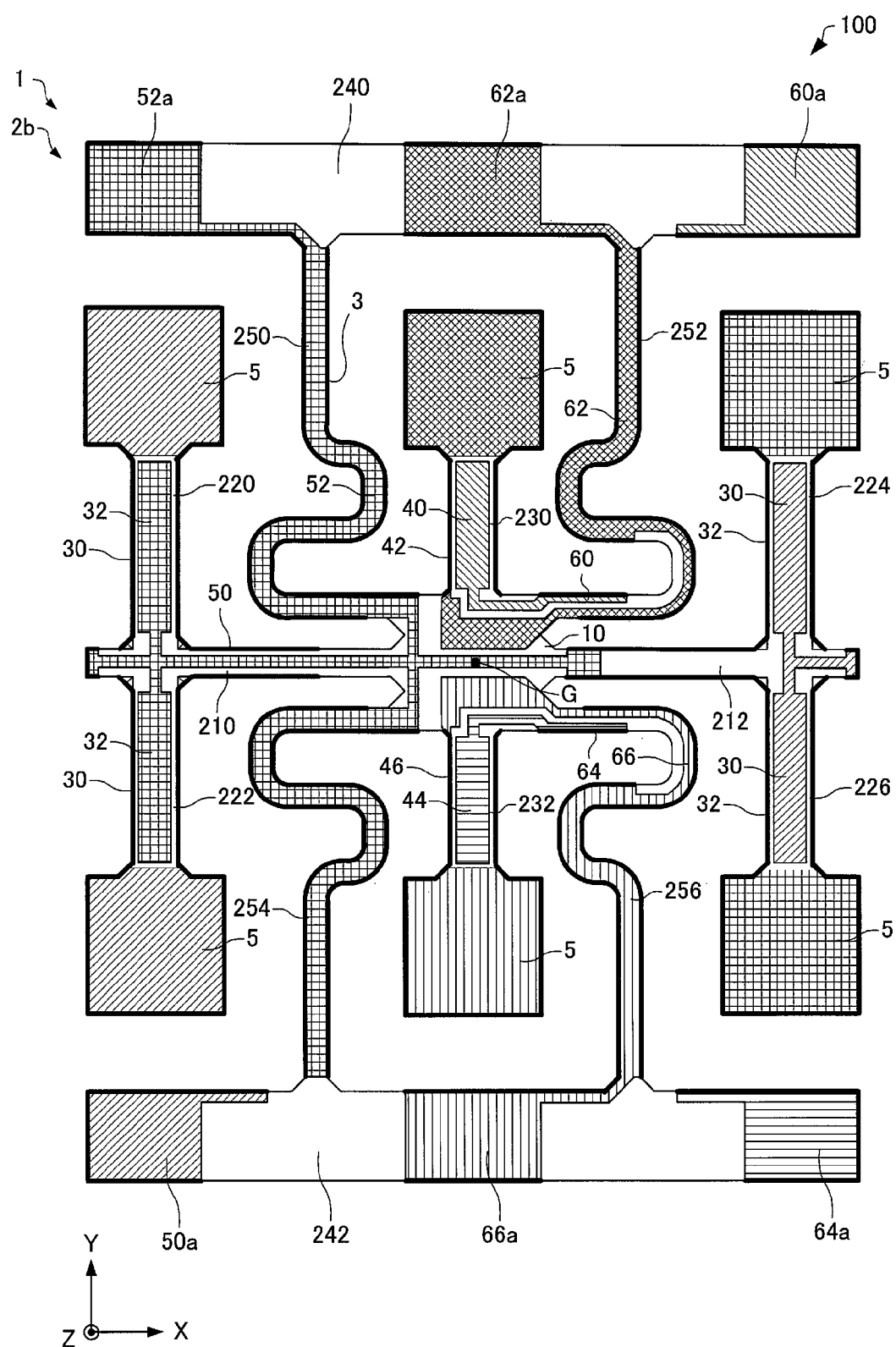
FIG. 3 is a plan view schematically showing the vibrating element according to the first embodiment.
Figure 4:
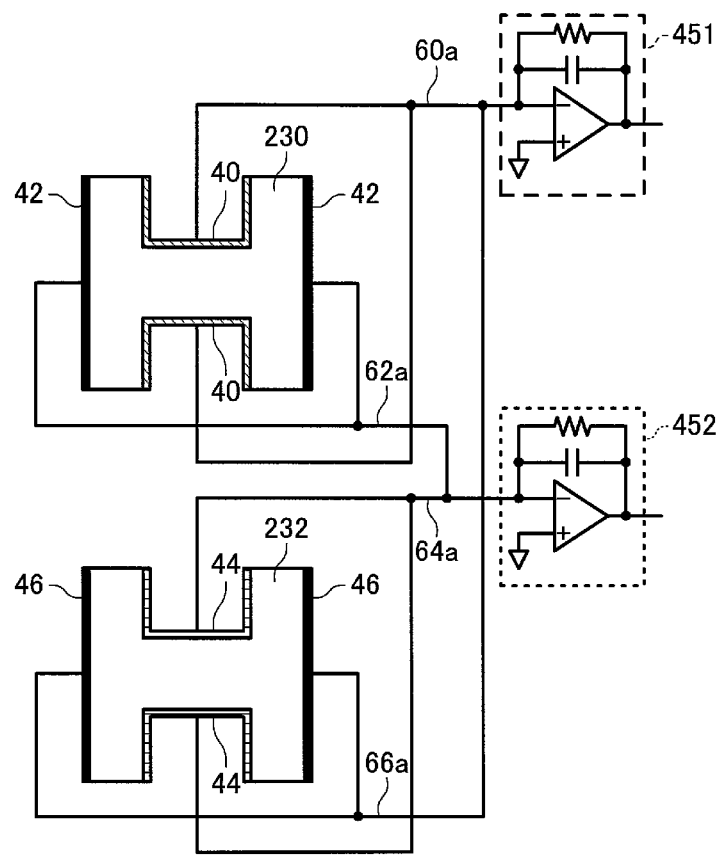
FIG. 4 is a cross-sectional view schematically showing the vibrating element according to the first embodiment.

Next, the vibrating element 100 according to the first embodiment will be described with reference to the accompanying diagrams. FIGS. 2 and 3 are plan views schematically showing the vibrating element 100 according to the first embodiment. FIG. 4 is a cross-sectional view schematically showing the vibrating element 100 according to the first embodiment. For the sake of convenience, FIG. 4 also shows the connection relationship between the vibrating element 100 and the charge amplifiers 451 and 452. The upper diagram in FIG. 4 is a cross-sectional view taken along line A-A' of FIG. 2, and the lower diagram in FIG. 4 is a cross-sectional view taken along line B-B' of FIG. 2. In the following diagrams including FIGS. 2 and 3, an X axis (first axis), a Y axis (second axis), and a Z axis (third axis) are shown as three axes perpendicular to each other.

FIG. 2 is a diagram when the vibrating element 100 is viewed from the first main surface 2a side, and is a diagram for explaining the configuration on the first main surface 2a side. FIG. 3 is a perspective view when the vibrating element 100 is viewed from the first main surface 2a side, and is a diagram for explaining the configuration on the second main surface 2b side.

As shown in FIGS. 2 and 3, the vibrating element 100 includes a base 10, connecting arms 210 and 212, the driving vibration arms 220, 222, 224, and 226, the detection vibration arms 230 and 232, support portions 240 and 242, beam portions 250, 252, 254, and 256, the driving input electrode 30, the driving output electrode 32, the first detection electrode 40, the second detection electrode 42, the third detection electrode 44, the fourth detection electrode 46, a driving input wiring line 50, a driving output wiring line 52, a first detection wiring line 60, a second detection wiring line 62, a third detection wiring line 64, and a fourth detection wiring line 66.

The base 10, the connecting arms 210 and 212, the driving vibration arms 220, 222, 224, and 226, the detection vibration arms 230 and 232, the support portions 240 and 242, and the beam portions 250, 252, 254, and 256 form a vibrating reed 1. The material of the vibrating reed 1 is a piezoelectric material, such as crystal, lithium tantalate, and lithium niobate. The vibrating reed 1 has the first and second main surfaces 2a and 2b facing in opposite directions and a side surface 3 connected to the first and second main surfaces 2a and 2b. In the illustrated example, the first main surface 2a is a surface facing in the +Z-axis direction, the second main surface 2b is a surface facing in the −Z-axis direction, and the side surface 3 is a surface having a perpendicular line that is perpendicular to the Z axis. The main surfaces 2a and 2b are planes, for example. The thickness (size in the Z-axis direction) of the vibrating reed 1 is about 100 µm, for example.

The base 10 has a center point G. The position of the center point G is a position of the center of gravity of the vibrating reed 1. The planar shape of the base 10 is a rectangle (approximate rectangle), for example.

The first and second connecting arms 210 and 212 extend in opposite directions along the X axis from the base 10. In the illustrated example, the first connecting arm 210 extends in the −X-axis direction from the base 10, and the second connecting arm 212 extends in the +X-axis direction from the base 10.

The first and second driving vibration arms 220 and 222 extend in opposite directions along the Y axis from the first connecting arm 210. In the illustrated example, the first driving vibration arm 220 extends in the +Y-axis direction from the first connecting arm 210, and the second driving vibration arm 222 extends in the −Y-axis direction from the first connecting arm 210. The driving vibration arms 220 and 222 are connected to the base 10 through the first connecting arm 210.

The third and fourth driving vibration arms 224 and 226 extend in opposite directions along the Y axis from the second connecting arm 212. In the illustrated example, the third driving vibration arm 224 extends in the +Y-axis direction from the second connecting arm 212, and the fourth driving vibration arm 226 extends in the −Y-axis direction from the second connecting arm 212. The driving vibration arms 224 and 226 are connected to the base 10 through the second connecting arm 212.

The first and second detection vibration arms 230 and 232 extend in opposite directions along the Y axis from the base 10. In the illustrated example, the first detection vibration arm 230 extends in the +Y-axis direction from the base 10, and the second detection vibration arm 232 extends in the −Y-axis direction from the base 10. The detection vibration arms 230 and 232 are connected to the base 10.

A wide portion 5 is provided at the distal end of each of the vibrating arms 220, 222, 224, 226, 230, and 232. The width (size in the X-axis direction) of the wide portion 5 is larger than those of other portions of the vibrating arms 220, 222, 224, 226, 230, and 232. Although not shown, a spindle portion may be provided in the wide portion 5. By adjusting the mass of the spindle portion, it is possible to adjust the vibration frequency of the vibrating arms 220, 222, 224, 226, 230, and 232.

The first support portion 240 is provided closer to the +Y-axis direction side than the vibrating arms 220, 224, and 230 are. The second support portion 242 is provided closer to the −Y-axis direction side than the vibrating arms 222, 226, and 232 are. The support portions 240 and 242 are portions fixed to the package when the vibrating element 100 is mounted. The support portions 240 and 242 support the base 10 through the beam portions 250, 252, 254, and 256.

The first and second beam portions 250 and 252 connect the base 10 and the first support portion 240 to each other. In the illustrated example, the first beam portion 250 extends from the base 10 to the first support portion 240 while passing between the first driving vibration arm 220 and the first detection vibration arm 230. The second beam portion 252 extends from the base 10 to the first support portion 240 while passing between the third driving vibration arm 224 and the first detection vibration arm 230.

The third and fourth beam portions 254 and 256 connect the base 10 and the second support portion 242 to each other. In the illustrated example, the third beam portion 254 extends from the base 10 to the second support portion 242 while passing between the second driving vibration arm 222 and the second detection vibration arm 232. The fourth beam portion 256 extends from the base 10 to the second support portion 242 while passing between the fourth driving vibration arm 226 and the second detection vibration arm 232.

Each of the beam portions 250, 252, 254, and 256 has an approximately S-shaped portion in a plan view. Therefore, the beam portions 250, 252, 254, and 256 can have high elasticity. As a result, the support portions 240 and 242 can support the base 10 through the beam portions 250, 252, 254, and 256 without inhibiting the vibration of the vibrating arms 220, 222, 224, 226, 230, and 232.

In the vibrating element 100 according to the first embodiment, as shown in FIGS. 2 and 3, the vibrating reed 1 is a so-called double T type vibrating reed.

As the driving input electrode 30, the driving output electrode 32, the first detection electrode 40, the second detection electrode 42, the third detection electrode 44, the fourth detection electrode 46, the driving input wiring line 50, the driving output wiring line 52, the first detection wiring line 60, the second detection wiring line 62, the third detection wiring line 64, and the fourth detection wiring line 66, for example, an electrode and a line obtained by stacking chromium and gold in this order from the vibrating reed 1 side are used.

The driving input electrode 30 is provided in each of the driving vibration arms 220, 222, 224, and 226. In the illustrated example, the driving input electrode 30 is provided on the side surface 3 and the wide portion 5 of the first driving vibration arm 220, the side surface 3 and the wide portion 5 of the second driving vibration arm 222, the main surfaces (main surfaces other than the wide portion 5) 2a and 2b of the third driving vibration arm 224, and the main surfaces (main surfaces other than the wide portion 5) 2a and 2b of the fourth driving vibration arm 226. The driving input electrode 30 is disposed plane-symmetrically with respect to a plane passing through the center point G and parallel to the XZ plane, for example. The driving input electrode 30 is an electrode to which a signal (driving signal) for driving the driving vibration arms 220, 222, 224, and 226 is input.

The driving output electrode 32 is provided in each of the driving vibration arms 220, 222, 224, and 226. In the illustrated example, the driving output electrode 32 is provided on the main surfaces (main surfaces other than the wide portion 5) 2a and 2b of the first driving vibration arm 220, the main surfaces (main surfaces other than the wide portion 5) 2a and 2b of the second driving vibration arm 222, the side surface 3 and the wide portion 5 of the third driving vibration arm 224, and the side surface 3 and the wide portion 5 of the fourth driving vibration arm 226. The driving output electrode 32 is disposed plane-symmetrically with respect to a plane passing through the center point G and parallel to the XZ plane, for example. The driving output electrode 32 is an electrode for outputting a signal based on the bending of the driving vibration arms 220, 222, 224, and 226.

Although not shown, the driving output electrode 32 may be provided at a position where the driving input electrode 30 is provided, or the driving input electrode 30 may be provided at a position where the driving output electrode 32 is provided.

The first detection electrode 40 is provided in the first detection vibration arm 230. In the illustrated example, the first detection electrode 40 is provided on the main surfaces (main surfaces other than the wide portion 5) 2a and 2b of the first detection vibration arm 230. The first detection electrode 40 is an electrode for detecting a signal (first detection signal) based on the bending of the first detection vibration arm 230 due to the Coriolis force.

The second detection electrode 42 is provided in the first detection vibration arm 230. In the illustrated example, the second detection electrode 42 is provided on the side surface 3 and the wide portion 5 of the first detection vibration arm 230. The second detection electrode 42 is an electrode for detecting a signal (second detection signal) based on the bending of the first detection vibration arm 230 due to the Coriolis force.

The third detection electrode 44 is provided in the second detection vibration arm 232. In the illustrated example, the third detection electrode 44 is provided on the main surfaces (main surfaces other than the wide portion 5) 2a and 2b of the second detection vibration arm 232. The third detection electrode 44 and the first detection electrode 40 are disposed plane-symmetrically with respect to a plane passing through the center point G and parallel to the XZ plane, for example. The third detection electrode 44 is an electrode for detecting a signal (third detection signal) based on the bending of the second detection vibration arm 232 due to the Coriolis force.

The fourth detection electrode 46 is provided in the second detection vibration arm 232. In the illustrated example, the fourth detection electrode 46 is provided on the side surface 3 and the wide portion 5 of the second detection vibration arm 232. The fourth detection electrode 46 and the second detection electrode 42 are disposed plane-symmetrically with respect to a plane passing through the center point G and parallel to the XZ plane, for example. The fourth detection electrode 46 is an electrode for detecting a signal (fourth detection signal) based on the bending of the second detection vibration arm 232 due to the Coriolis force.

In the present embodiment, as shown in FIG. 4, grooves are provided on the main surfaces 2a and 2b of the vibrating arms 230 and 232, and the electrodes 40 and 44 are provided inside the grooves. Although not shown, grooves may also be provided on the main surfaces 2a and 2b of the vibrating arms 220, 222, 224, and 226, and the electrodes 30 and 32 may be provided inside the grooves.

The driving input wiring line 50 is provided in the base 10, the connecting arms 210 and 212, the second support portion 242, and the third beam portion 254. In the illustrated example, the driving input wiring line 50 is provided on the first main surface 2a and the side surface 3 of the base 10, the first main surface 2a of the first connecting arm 210, the main surfaces 2a and 2b and the side surface 3 of the second connecting arm 212, the main surfaces 2a and 2b and the side surface 3 of the second support portion 242, and the side surface 3 of the third beam portion 254. The driving input electrodes 30 provided in the vibrating arms 220, 222, 224, and 226 are electrically connected to each other by the driving input wiring line 50. The driving input wiring line 50 provided in the second support portion 242 is a terminal portion 50a. In the illustrated example, the planar shape of the terminal portion 50a is a rectangle. The terminal portion 50a is connected to an external member (for example, a bonding wire), and a driving signal output from the driving circuit 440 is input to the driving input electrode 30 through the external member and the driving input wiring line 50.

The driving output wiring line 52 is provided in the base 10, the connecting arms 210 and 212, the first support portion 240, and the first beam portion 250. In the illustrated example, the driving output wiring line 52 is provided on the second main surface 2b of the base 10, the main surfaces 2a and 2b and the side surface 3 of the first connecting arm 210, the second main surface 2b and the side surface 3 of the second connecting arm 212, the main surfaces 2a and 2b and the side surface 3 of the first support portion 240, and the second main surface 2b and the side surface 3 of the first beam portion 250. The driving output electrodes 32 provided in the vibrating arms 220, 222, 224, and 226 are electrically connected to each other by the driving output wiring line 52. The driving output wiring line 52 provided in the first support portion 240 is a terminal portion 52a. In the illustrated example, the planar shape of the terminal portion 52a is a rectangle. The terminal portion 52a is connected to an external member (for example, a bonding wire), and a signal output from the driving output electrode 32 is input to the driving circuit 440 through the driving output wiring line 52 and the external member.

The first detection wiring line 60 is provided in the base 10, the first support portion 240, and the second beam portion 252. In the illustrated example, the first detection wiring line 60 is provided on the main surfaces 2a and 2b of the base 10, the main surfaces 2a and 2b and the side surface 3 of the first support portion 240, and the first main surface 2a and the side surface 3 of the second beam portion 252. The first detection wiring line 60 is connected to the first detection electrode 40. The first detection wiring line 60 provided in the first support portion 240 is a terminal portion 60a. In the illustrated example, the planar shape of the terminal portion 60a is a rectangle. The terminal portion 60a is connected to an external member (for example, a bonding wire), and a first detection signal output from the first detection electrode 40 is input to the charge amplifier 451 of the detection circuit 450 through the first detection wiring line 60 and the external member.

The second detection wiring line 62 is provided in the base 10, the first support portion 240, and the second beam portion 252. In the illustrated example, the second detection wiring line 62 is provided on the main surfaces 2a and 2b and the side surface 3 of the base 10, the main surfaces 2a and 2b and the side surface 3 of the first support portion 240, and the main surfaces 2a and 2b and the side surface 3 of the second beam portion 252. The second detection wiring line 62 is connected to the second detection electrode 42. The second detection wiring line 62 provided in the first support portion 240 is a terminal portion 62a. In the illustrated example, the planar shape of the terminal portion 62a is a rectangle. The terminal portion 62a is connected to an external member (for example, a bonding wire), and a second detection signal output from the second detection electrode 42 is input to the charge amplifier 452 of the detection circuit 450 through the second detection wiring line 62 and the external member.

The third detection wiring line 64 is provided in the base 10, the second support portion 242, and the fourth beam portion 256. In the illustrated example, the third detection wiring line 64 is provided on the main surfaces 2a and 2b of the base 10, the main surfaces 2a and 2b and the side surface 3 of the second support portion 242, and the first main surface 2a and the side surface 3 of the fourth beam portion 256. The third detection wiring line 64 is connected to the third detection electrode 44. The third detection wiring line 64 provided in the second support portion 242 is a terminal portion 64a. In the illustrated example, the planar shape of the terminal portion 64a is a rectangle. The terminal portion 64a is connected to an external member (for example, a bonding wire), and a third detection signal output from the third detection electrode 44 is input to the charge amplifier 452 of the detection circuit 450 through the third detection wiring line 64 and the external member.

The fourth detection wiring line 66 is provided in the base 10, the second support portion 242, and the fourth beam portion 256. In the illustrated example, the fourth detection wiring line 66 is provided on the main surfaces 2a and 2b and the side surface 3 of the base 10, the main surfaces 2a and 2b and the side surface 3 of the second support portion 242, and the main surfaces 2a and 2b and the side surface 3 of the fourth beam portion 256. The fourth detection wiring line 66 is connected to the fourth detection electrode 46. The fourth detection wiring line 66 provided in the second support portion 242 is a terminal portion 66a. In the illustrated example, the planar shape of the terminal portion 66a is a rectangle. The terminal portion 66a is connected to an external member (for example, a bonding wire), and a fourth detection signal output from the fourth detection electrode 46 is input to the charge amplifier 451 of the detection circuit 450 through the fourth detection wiring line 66 and the external member.

In FIGS. 2 and 3, the electrodes 30, 32, 40, 42, 44, and 46 and the wiring lines 50, 52, 60, 62, 64, and 66 provided on the side surface 3 of the vibrating reed 1 are indicated by thick lines.

Figure 5A:
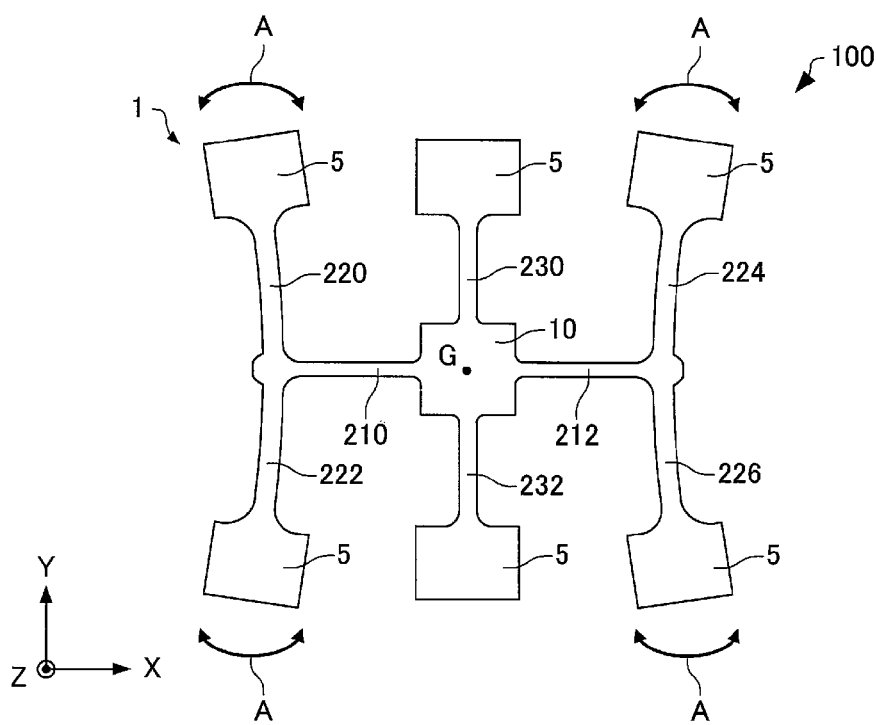
FIGS. 5A and 5B are plan views for explaining the operation of the vibrating element according to the first embodiment.
Figure 5B:
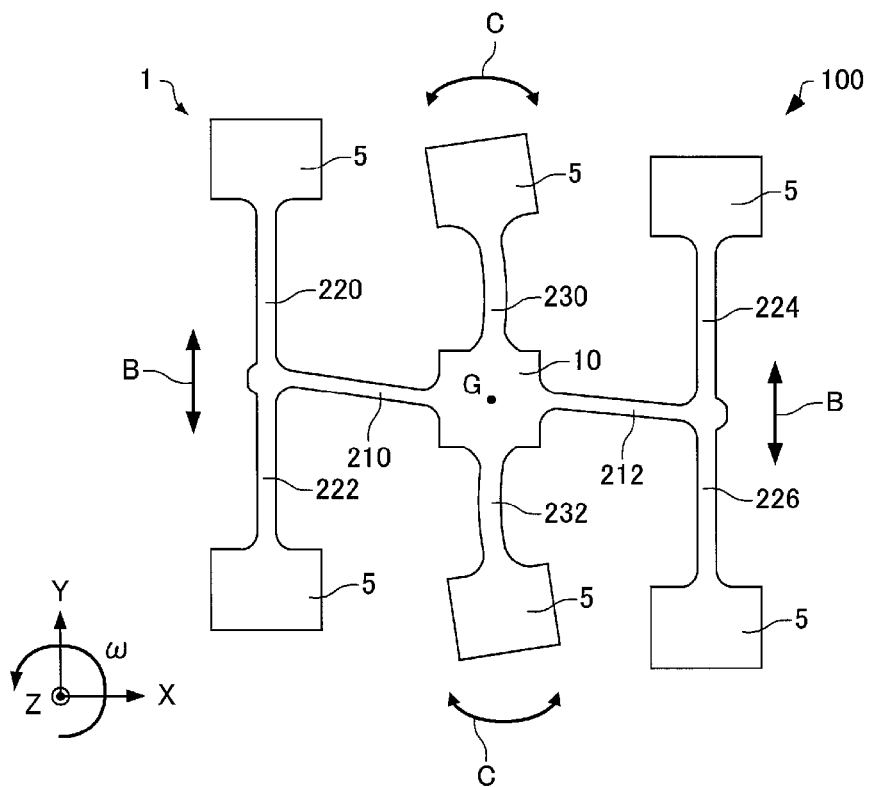

Next, the operation of the vibrating element 100 will be described. FIGS. 5A and 5B are plan views for explaining the operation of the vibrating element 100. For the sake of convenience, members other than the base 10, the connecting arms 210 and 212, and the vibrating arms 220, 222, 224, 226, 230, and 232 are not shown in FIGS. 5A and 5B.

As shown in FIG. 5A, in the vibrating element 100, when a predetermined AC voltage is applied to the driving input electrode 30 provided in each of the driving vibration arms 220, 222, 224, and 226 in a state where no angular velocity is applied, the driving vibration arms 220, 222, 224, and 226 perform bending vibrations in a direction indicated by the arrow A within the XY plane. In this case, the driving vibration arms 220 and 222 and the driving vibration arms 224 and 226 vibrate plane-symmetrically with respect to a plane passing through the center point G and parallel to the YZ plane. Therefore, the base 10, the connecting arms 210 and 212, and the detection vibration arms 230 and 232 hardly vibrate.

As shown in FIG. 5B, when an angular velocity) around the Z axis is applied to the vibrating element 100 in a state where the driving vibration arms 220, 222, 224, and 226 perform such driving vibrations, Coriolis force acts on the driving vibration arms 220, 222, 224, and 226. Accordingly, the driving vibration arms 220, 222, 224, and 226 vibrate in a direction indicated by the arrow B. The vibration in the direction indicated by the arrow B is a vibration in a circumferential direction with respect to the center point G. Then, the connecting arms 210 and 212 vibrate in the direction indicated by the arrow B by the vibration of the driving vibration arms 220, 222, 224, and 226. This vibration is transmitted to the detection vibration arms 230 and 232 through the base 10, thereby vibrating the detection vibration arms 230 and 232 as indicated by the arrow C. The vibration in the direction indicated by the arrow C is a vibration in an opposite direction in the circumferential direction to the direction indicated by the arrow B with respect to the center point G. By the bending vibrations of the detection vibration arms 230 and 232, the first detection signal, the second detection signal, the third detection signal, and the fourth detection signal are generated in the first detection electrode 40, the second detection electrode 42, the third detection electrode 44, and the fourth detection electrode 46, respectively.

In this case, the first and second detection signals have opposite electrical polarities, and the third and fourth detection signals have opposite electrical polarities. In addition, the first and fourth detection signals have the same electrical polarity, and the second and third detection signals have the same electrical polarity. For example, negative charge δ− is generated in the second and third detection electrodes 42 and 44 when positive charge δ+ is generated in the first and fourth detection electrodes 40 and 46, and positive charge δ+ is generated in the second and third detection electrodes 42 and 44 when negative charge δ− is generated in the first and fourth detection electrodes 40 and 46. The first detection signal, the second detection signal, the third detection signal, and the fourth detection signal are output to the detection circuit 450 from the terminal portion 60a, the terminal portion 62a, the terminal portion 64a, and the terminal portion 66a, respectively, and the detection circuit 450 can calculate an angular velocity around the Z axis with these detection signals.

Hereinafter, a state where no angular velocity is detected as shown in FIG. 5A will be referred to as a "driving mode", and a state where an angular velocity is detected as shown in FIG. 5B will be referred to as a "detection mode".

FIGS. 6A to 6F show examples of the signal waveform in the detection mode. FIG. 6A shows a signal waveform of the first detection signal output from the terminal portion 60a. FIG. 6B shows a signal waveform of the second detection signal output from the terminal portion 62a. FIG. 6C shows a signal waveform of the third detection signal output from the terminal portion 64a. FIG. 6D shows a signal waveform of the fourth detection signal output from the terminal portion 66a. FIG. 6E is a signal waveform of an input signal of the charge amplifier 451, that is, a signal waveform of a sum signal of the first and fourth detection signals. FIG. 6F is a signal waveform of an input signal of the charge amplifier 452, that is, a signal waveform of a sum signal of the second and third detection signals.

As shown in FIG. 4, in the physical quantity detecting device 400 according to the present embodiment, both the terminal portions 60a and 66a of the vibrating element 100 are connected to the inverting input terminal (− terminal) of the operational amplifier provided in the charge amplifier 451. Accordingly, the input signal of the charge amplifier 451 is a signal obtained by adding the first and fourth detection signals. Since the first and fourth detection signals have the same electrical polarity (the same phase), the amplitude of the input signal of the charge amplifier 451 is almost equal to the sum of the amplitude of the first detection signal and the amplitude of the fourth detection signal.

Similarly, both the terminal portions 62a and 64a of the vibrating element 100 are connected to the inverting input terminal (− terminal) of the operational amplifier provided in the charge amplifier 452. Accordingly, the input signal of the charge amplifier 452 is a signal obtained by adding the second and third detection signals. Since the second and third detection signals have the same electrical polarity (the same phase), the amplitude of the input signal of the charge amplifier 452 is almost equal to the sum of the amplitude of the second detection signal and the amplitude of the third detection signal.

In addition, the sum signal of the first and fourth detection signals (that is, the input signal of the charge amplifier 451) and the sum signal of the second and third detection signals (that is, the input signal of the charge amplifier 452) have opposite electrical polarities (opposite phases). Therefore, according to the physical quantity detecting device 400 of the present embodiment, a fixed potential is supplied to the second and fourth detection electrodes 42 and 46, and only the first detection signal is input to the charge amplifier 451. For this reason, compared with a known physical quantity detecting device in which only the third detection signal is input to the charge amplifier 452, if the structure of the vibrating element 100 is the same, the amount of charges (the amount of current) input to the detection circuit 450 when the vibrating element 100 detects the same angular velocity is increased. Accordingly, the element sensitivity (angular velocity detection sensitivity) of the vibrating element 100 is improved. As a result, since the S/N of the output signal of the detection circuit 450 is improved, it is possible to realize low noise. In addition, since the element sensitivity is increased, the temperature characteristics of the output signal of the detection circuit 450 also appear relatively small. Therefore, according to the present embodiment, it is possible to realize the highly accurate and highly stable physical quantity detecting device 400.

In addition, since the first and fourth detection electrodes 40 and 46 are connected to the inverting input terminal (− terminal) of the operational amplifier provided in the charge amplifier 451, the first and fourth detection electrodes 40 and 46 are virtually short-circuited to the non-inverting input terminal (+ terminal) of the operational amplifier. Accordingly, the first and fourth detection electrodes 40 and 46 always have a reference potential. Similarly, the second and third detection electrodes 42 and 44 are connected to the inverting input terminal (− terminal) of the operational amplifier provided in the charge amplifier 452. Accordingly, since the second and third detection electrodes 42 and 44 are virtually short-circuited to the non-inverting input terminal (+ terminal) of the operational amplifier. Accordingly, the second and third detection electrodes 42 and 44 always have a reference potential. That is, in the present embodiment, the first detection electrode 40, the second detection electrode 42, the third detection electrode 44, and the fourth detection electrode 46 always have the same electric potential, and accordingly, no electric field is generated between the electrodes.

Incidentally, each of the driving vibration arms 220, 222, 224, and 226 has a resonance frequency $f_{dr}$ determined by the length, thickness, material, and the like, and each of the detection vibration arms 230 and 232 has a resonance frequency $f_{dt}$ determined by the length, thickness, material, and the like. The difference between the resonance frequencies $f_{dr}$ and $f_{dt}$ is called a detuning frequency.

Figure 7A:
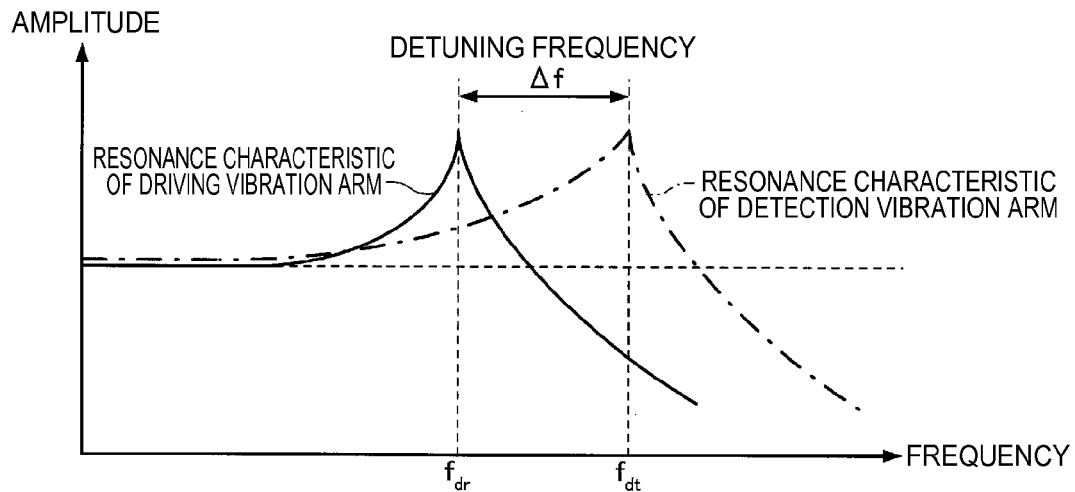
FIGS. 7A and 7B are diagrams showing examples of the resonance characteristic of a driving vibration arm and the resonance characteristic of a detection vibration arm.
Figure 7B:
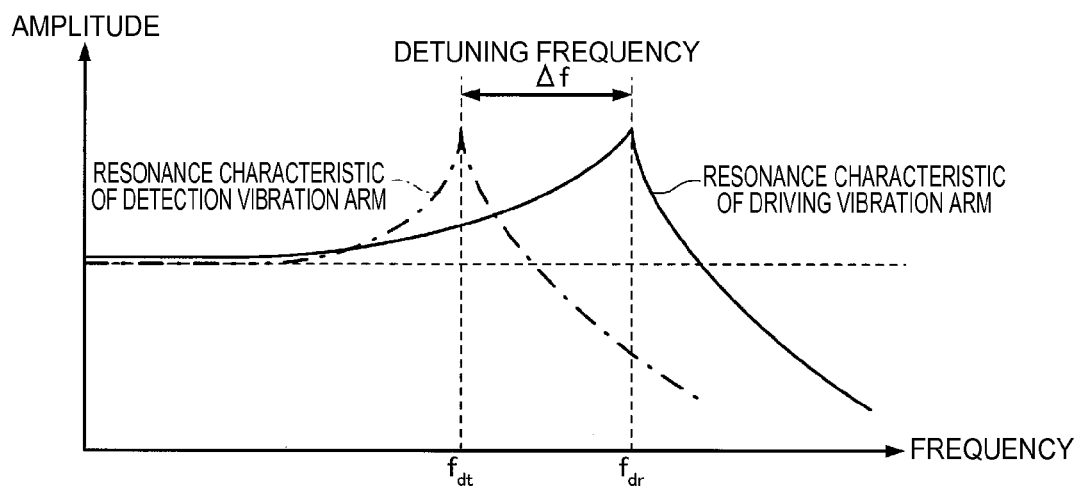

FIGS. 7A and 7B are diagrams showing examples of the resonance characteristic of the driving vibration arms 220, 222, 224, and 226 and the resonance characteristic of the detection vibration arms 230 and 232. FIG. 7A shows an example when $f_{dr}<f_{dt}$, and the detuning frequency $\Delta f=f_{dt}-f_{dr}$. On the other hand, FIG. 7B shows an example when $f_{dr}>f_{dt}$, and the detuning frequency $\Delta f=f_{dr}-f_{dt}$.

In the driving mode, the driving vibration arms 220, 222, 224, and 226 vibrate at the resonance frequency $f_{dr}$ by the driving signal output from the driving circuit 440. Also in the detection mode, the driving vibration arms 220, 222, 224, and 226 vibrate at the resonance frequency $f_{dr}$, and the vibration of the detection vibration arms 230 and 232 is excited at the driving frequency $f_{dr}$. Accordingly, the detection vibration arms 230 and 232 also vibrate at the frequency $f_{dr}$. As the resonance frequency $f_{dr}$ in the driving mode becomes close to the resonance frequency $f_{dt}$ in the detection mode, that is, as the detuning frequency $\Delta f$ becomes low, the amplitude of the detection vibration arms 230 and 232 becomes large. Therefore, since the amount of charges generated in the detection electrodes 40, 42, 44, and 46 is increased, the element sensitivity becomes high. That is, the element sensitivity is inversely proportional to the detuning frequency $\Delta f$. However, as the detuning frequency $\Delta f$ becomes low, various problems are likely to occur. For example, since the amplitude of the detection vibration arms 230 and 232 is increased, the detection vibration arms 230 and 232 are easily broken. In addition, since an undesired signal in a state where no angular velocity is input is increased, the S/N is reduced. For this reason, it is preferable to set the detuning frequency $\Delta f$ as high as possible. However, if the element sensitivity becomes low, angular velocity detection sensitivity becomes low. Therefore, there has been no choice but to lower the detuning frequency $\Delta f$ to some extent.

In contrast, in the physical quantity detecting device 400 according to the present embodiment, the element sensitivity of the vibrating element 100 is improved compared with a known vibrating element in which the second and fourth detection electrodes 42 and 46 are grounded. If the element sensitivity of a known vibrating element is sufficient as the element sensitivity of the vibrating element 100, it is possible to increase the detuning frequency $\Delta f$ by the amount. As a result, it is possible to realize the highly reliable physical quantity detecting device 400.

1-2. Second Embodiment

In the physical quantity detecting device 400 according to the first embodiment described above, in the vibrating element 100, the sensitivity is increased by detecting the charge also from the second and fourth detection electrodes 42 and 46 that are grounded in the known art. However, since there is no grounded electrode, electrostatic crosstalk (electrostatic coupling) through the parasitic capacitance generated between the driving input electrode 30 and the driving output electrode 32 and the first detection electrode 40, the second detection electrode 42, the third detection electrode 44, and the fourth detection electrode 46 is increased. Therefore, in a physical quantity detecting device 400 according to a second embodiment, in a vibrating element 100, electrostatic coupling is suppressed by providing a wiring line for shielding, which has a fixed electric potential, between the driving input electrode 30 and the driving output electrode 32 and the first detection electrode 40, the second detection electrode 42, the third detection electrode 44, and the fourth detection electrode 46. Since the functional block diagram of the physical quantity detecting device according to the second embodiment is the same as that shown in FIG. 1, illustration and explanation thereof will be omitted.

Configuration of a Vibrating Element

Figure 8:
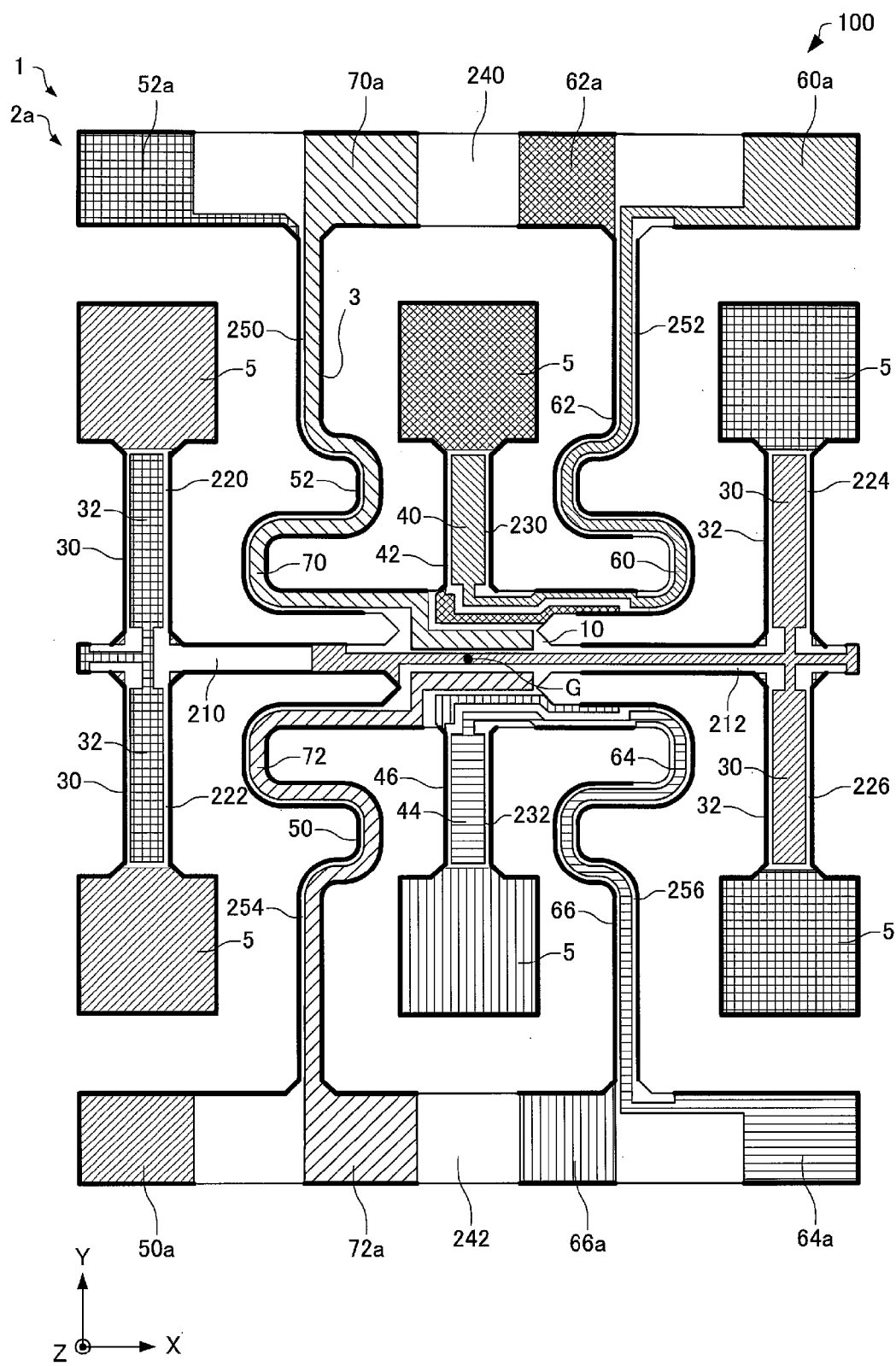
FIG. 8 is a plan view schematically showing a vibrating element according to a second embodiment.
Figure 9:
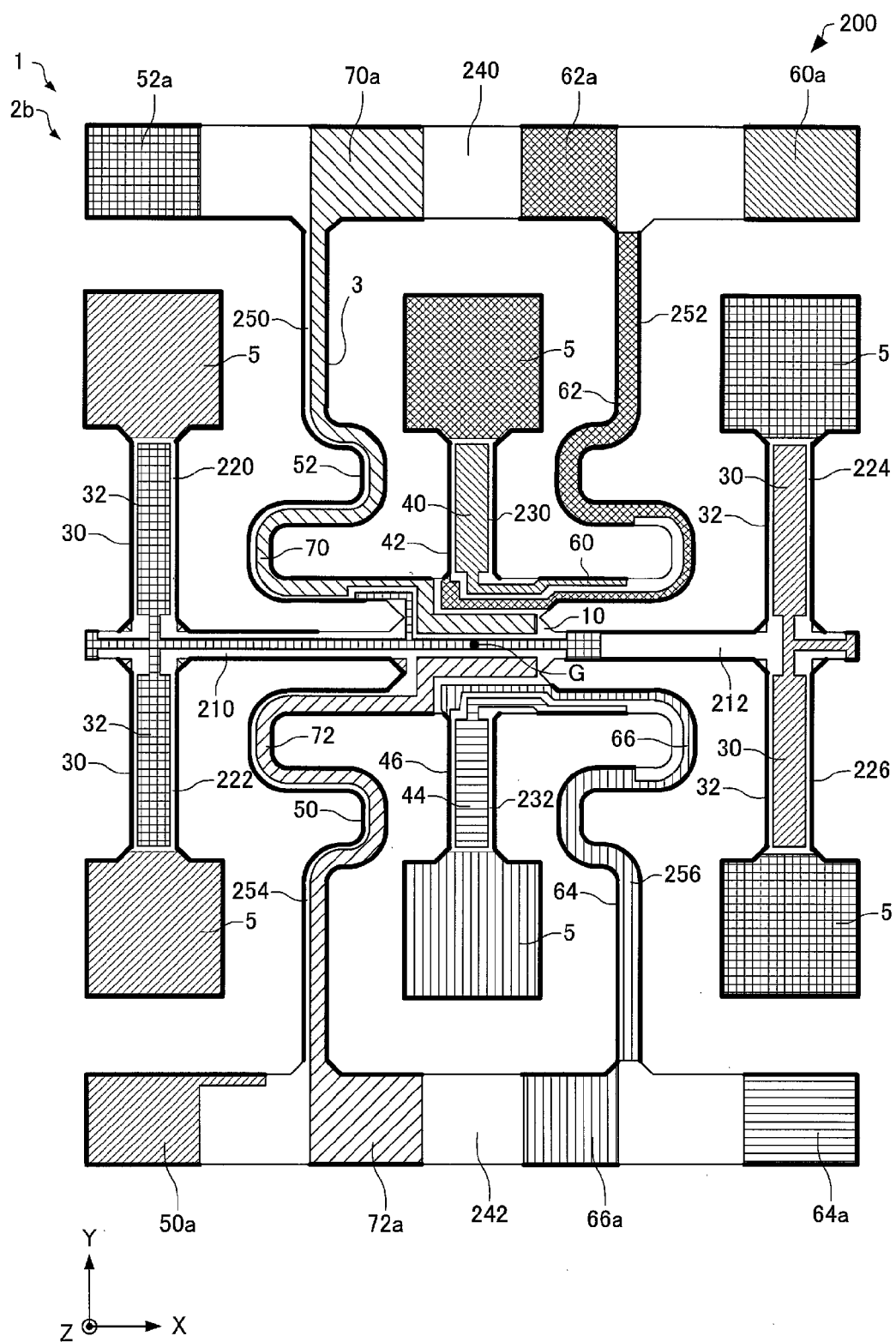
FIG. 9 is a plan view schematically showing the vibrating element according to the second embodiment.

Next, the vibrating element 100 according to the second embodiment will be described with reference to the accompanying diagrams. FIGS. 8 and 9 are plan views schematically showing the vibrating element 100 according to the second embodiment. FIG. 8 is a diagram when the vibrating element 100 is viewed from the first main surface 2a side, and is a diagram for explaining the configuration on the first main surface 2a side. FIG. 9 is a perspective view when the vibrating element 100 is viewed from the first main surface 2a side, and is a diagram for explaining the configuration on the second main surface 2b side.

Hereinafter, in the vibrating element 100 according to the second embodiment, components having the same functions as the components of the vibrating element 100 according to the first embodiment described above are denoted by the same reference numerals, and detailed explanation thereof will be omitted.

As shown in FIGS. 8 and 9, the vibrating element 100 according to the second embodiment includes a driving input electrode 30, a driving output electrode 32, detection electrodes 40, 42, 44, and 46, a driving input wiring line 50, a driving output wiring line 52, detection wiring lines 60, 62, 64, and 66, and fixed potential wiring lines 70 and 72.

In FIGS. 8 and 9, the electrodes 30, 32, 40, 42, 44, and 46 and the wiring lines 50, 52, 60, 62, 64, 66, 70, and 72 provided on the side surface 3 of the vibrating reed 1 are indicated by thick lines.

The first fixed potential wiring line 70 is provided in the base 10, the first support portion 240, and the first beam portion 250. Specifically, the first fixed potential wiring line 70 is provided between the driving input wiring line 50 and the first detection wiring line 60 and between the driving input wiring line 50 and the second detection wiring line 62 in plan view of the main surfaces 2a and 2b of the base 10. In the illustrated example, the detection wiring lines 60 and 62 are provided on the +X-axis direction side of the first fixed potential wiring line 70, and the driving input wiring line 50 is provided on the −X-axis direction side of the first fixed potential wiring line 70.

The first fixed potential wiring line 70 is further provided on the main surfaces 2a and 2b and the side surface 3 of the first support portion 240 and the main surfaces 2a and 2b and the side surface 3 of the first beam portion 250. The first fixed potential wiring line 70 provided in the first support portion 240 is a terminal portion 70a.

The second fixed potential wiring line 72 is provided in the base 10, the second support portion 242, and the third beam portion 254. Specifically, the second fixed potential wiring line 72 is provided between the driving input wiring line 50 and the third detection wiring line 64 and between the driving input wiring line 50 and the fourth detection wiring line 66 in plan view of the main surfaces 2a and 2b of the base 10. In the illustrated example, the driving input wiring line 50 is provided on the +X-axis direction side of the second fixed potential wiring line 72, and the detection wiring lines 64 and 66 are provided on the −X-axis direction side of the second fixed potential wiring line 72.

The second fixed potential wiring line 72 is further provided on the main surfaces 2a and 2b and the side surface 3 of the second support portion 242 and the main surfaces 2a and 2b and the side surface 3 of the third beam portion 254. The second fixed potential wiring line 72 provided in the second support portion 242 is a terminal portion 72a.

The fixed potential wiring lines 70 and 72 are wiring lines to which a fixed electric potential is input. Specifically, each of the fixed potential wiring lines 70 and 72 has a ground potential. That is, the fixed potential wiring lines 70 and 72 are grounded.

In particular, in the base 10, the fixed potential wiring line 70 is provided between the driving input electrode 30 and the first and second detection electrodes 40 and 42 as shown in FIG. 8, and is provided between the driving output electrode 32 and the first and second detection electrodes 40 and 42 as shown in FIG. 9. In addition, in the base 10, the fixed potential wiring line 72 is provided between the driving input electrode 30 and the third and fourth detection electrodes 44 and 46 as shown in FIG. 8, and is provided between the driving output electrode 32 and the third and fourth detection electrodes 44 and 46 as shown in FIG. 9.

Therefore, in the vibrating element 100 according to the second embodiment, it is possible to suppress the electrostatic coupling between the driving input electrode 30 and the driving output electrode 32 and the first and second detection electrodes 40 and 42 with the first fixed potential wiring line 70 and suppress the electrostatic coupling between the driving input electrode 30 and the driving output electrode 32 and the third and fourth detection electrodes 44 and 46 with the second fixed potential wiring line 72. Thus, according to the present embodiment, noise due to the driving signal being mixed in the detection signal is reduced by a reduction in the electrostatic coupling. Therefore, it is possible to realize the more accurate and stable physical quantity detecting device 400.

1-3. Third Embodiment

In a physical quantity detecting device 400 according to a third embodiment, the structure of the vibrating element 100 is different from that in the first and second embodiments. Since the functional block diagram of the physical quantity detecting device according to the third embodiment is the same as that shown in FIG. 1, illustration and explanation thereof will be omitted.

Configuration of a Vibrating Element

Figure 10:
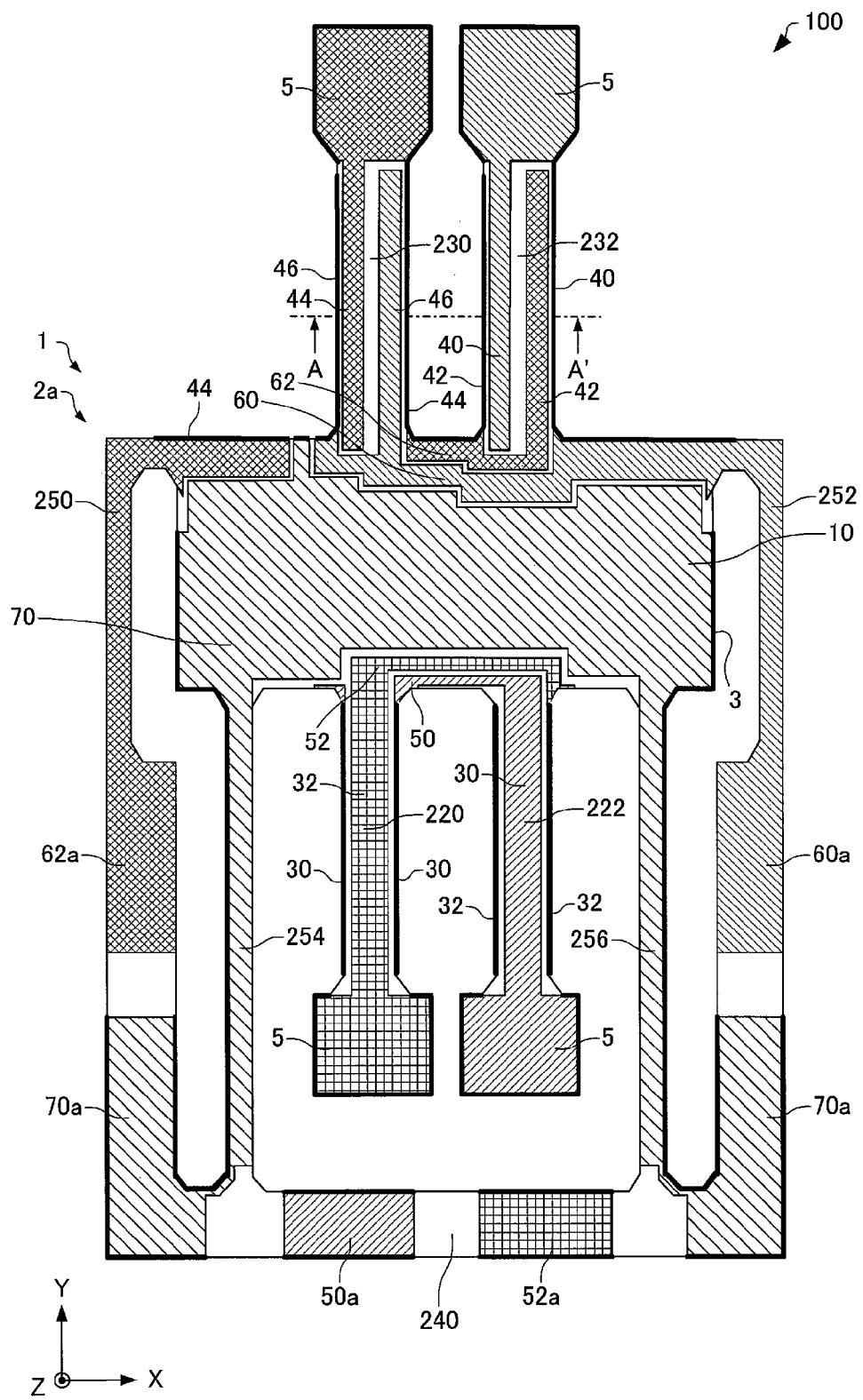
FIG. 10 is a plan view schematically showing a vibrating element according to a third embodiment.
Figure 11:
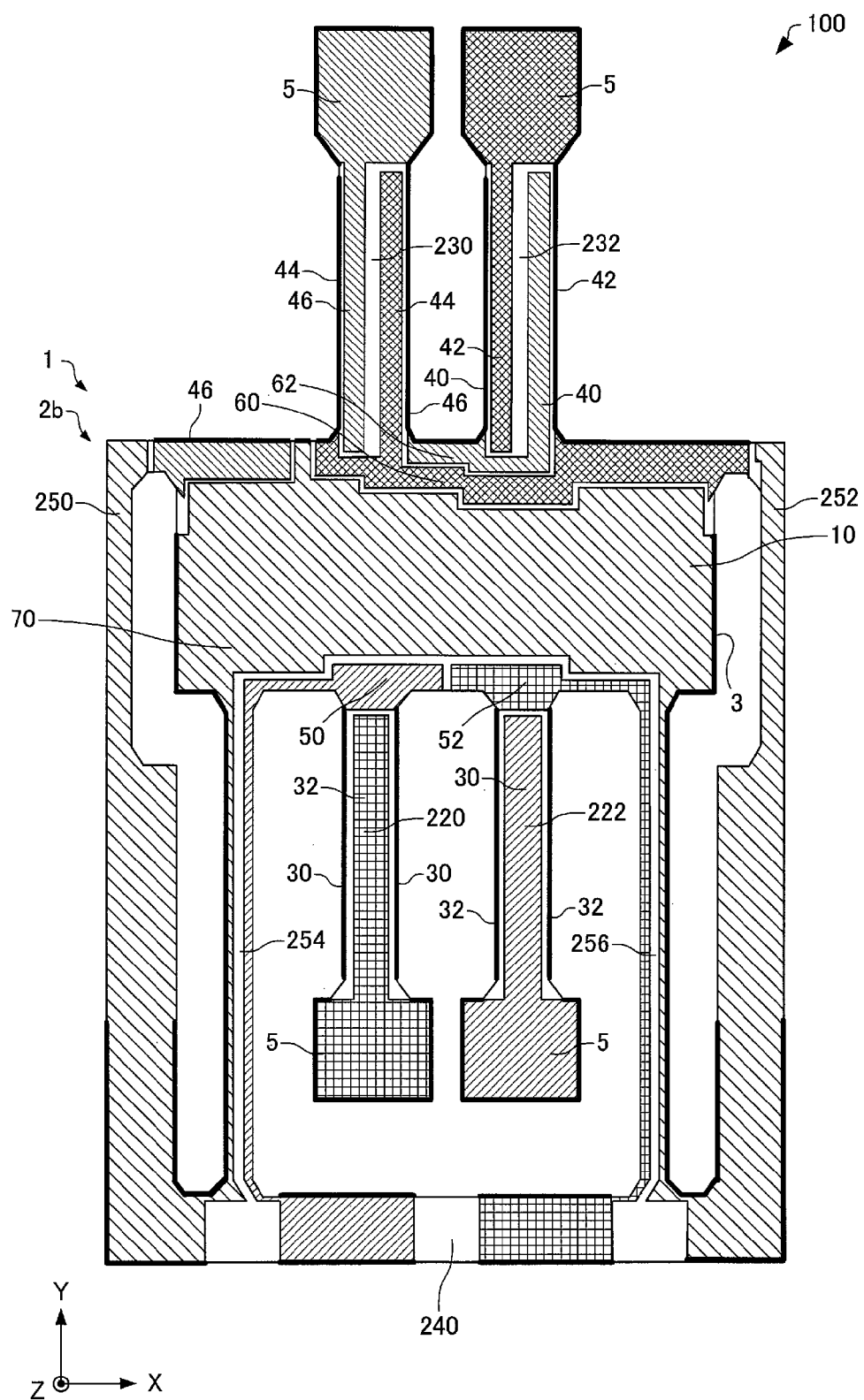
FIG. 11 is a plan view schematically showing the vibrating element according to the third embodiment.
Figure 12:
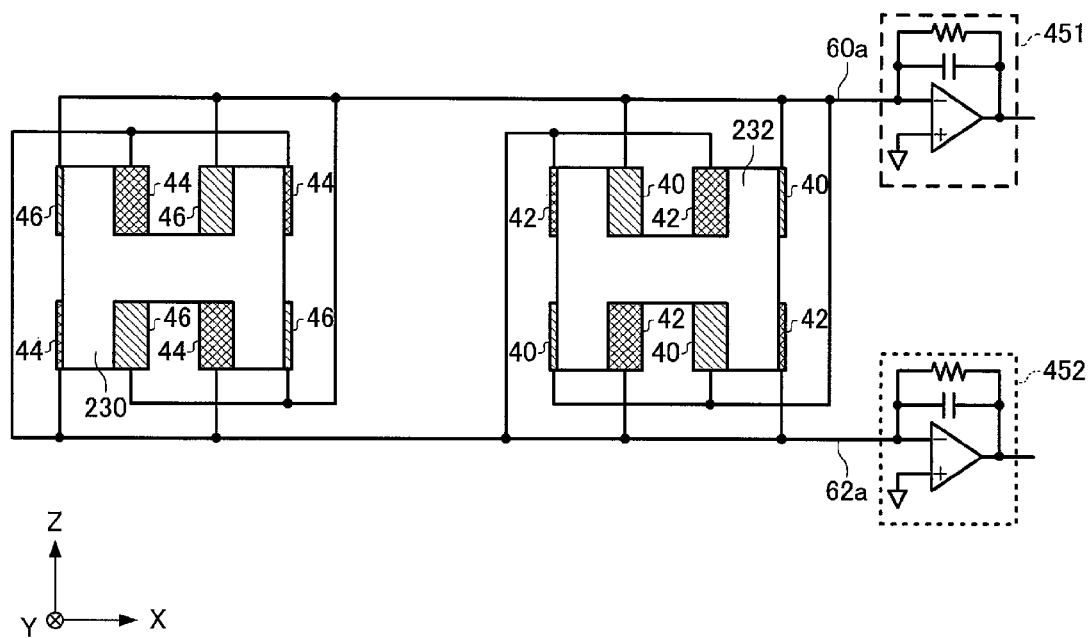
FIG. 12 is a cross-sectional view schematically showing the vibrating element according to the third embodiment.

Next, the vibrating element 100 according to the third embodiment will be described with reference to the accompanying diagrams. FIGS. 10 and 11 are plan views schematically showing the vibrating element 100 according to the third embodiment. FIG. 12 is a cross-sectional view taken along the line A-A' of FIG. 10, which schematically shows the vibrating element 100 according to the third embodiment. For the sake of convenience, FIG. 12 also shows the connection relationship between the vibrating element 100 and the charge amplifiers 451 and 452.

FIG. 10 is a diagram when the vibrating element 100 is viewed from the first main surface 2*a* side, and is a diagram for explaining the configuration on the first main surface 2*a* side. FIG. 11 is a perspective view when the vibrating element 100 is viewed from the first main surface 2*a* side, and is a diagram for explaining the configuration on the second main surface 2*b* side.

Hereinafter, in the vibrating element 100 according to the third embodiment, components having the same functions as the components of the vibrating element 100 according to the first embodiment described above are denoted by the same reference numerals, and detailed explanation thereof will be omitted.

In the vibrating element 100 according to the first embodiment described above, as shown in FIG. 2, the vibrating reed 1 is a double T-shaped vibrating reed. In contrast, in the vibrating element 100 according to the third embodiment, as shown in FIGS. 10 to 12, the vibrating reed 1 is a so-called H type vibrating reed.

As shown in FIGS. 10 to 12, the vibrating reed 1 includes a base 10, driving vibration arms 220 and 222, detection vibration arms 230 and 232, a support portion 240, and beam portions 250, 252, 254, and 256.

The first and second driving vibration arms 220 and 222 extend along the Y axis from the base 10. In the illustrated example, the driving vibration arms 220 and 222 extend in the −Y-axis direction from the base 10. The driving vibration arms 220 and 222 are disposed side by side along the X axis. In the illustrated example, the first driving vibration arm 220 is disposed closer to the −X-axis direction side than the second driving vibration arm 222 is.

The first and second detection vibration arms 230 and 232 extend in the opposite direction to the extension direction of the driving vibration arms 220 and 222 from the base 10. In the illustrated example, the detection vibration arms 230 and 232 extend in the +Y-axis direction from the base 10. The detection vibration arms 230 and 232 are disposed side by side along the X axis. In the illustrated example, the first detection vibration arm 230 is disposed closer to the −X-axis direction side than the second detection vibration arm 232 is.

A wide portion 5 is provided at the distal end of each of the vibrating arms 220, 222, 230, and 232. The width (size in the X-axis direction) of the wide portion 5 is larger than those of other portions of the vibrating arms 220, 222, 230, and 232. Although not shown, a spindle portion may be provided in the wide portion 5. By adjusting the mass of the spindle portion, it is possible to adjust the vibration frequency of the vibrating arms 220, 222, 230, and 232.

The support portion 240 is provided closer to the −Y-axis direction side than the base 10 is. The support portion 240 is a portion fixed to the package when the vibrating element 100 is mounted. The support portion 240 supports the base 10 through the beam portions 250, 252, 254, and 256.

The first and second beam portions 250 and 252 extend from the base 10 to the support portion 240, and connect the base 10 and the support portion 240 to each other.

The third and fourth beam portions 254 and 256 extend from the base 10 to the support portion 240, and connect the base 10 and the support portion 240 to each other.

As a result, the support portion 240 can support the base 10 through the beam portions 250, 252, 254, and 256 without inhibiting the vibration of the vibrating arms 220, 222, 230, and 232.

As shown in FIGS. 10 to 12, the vibrating element 100 includes the driving input electrode 30, the driving output electrode 32, the detection electrodes 40, 42, 44, and 46, the driving input wiring line 50, the driving output wiring line 52, the detection wiring lines 60 and 62, and the fixed potential wiring line 70.

The driving input electrode 30 is provided in the driving vibration arms 220 and 222. In the illustrated example, the driving input electrode 30 is provided on the side surface 3 of the first driving vibration arm 220 and the main surfaces 2*a* and 2*b* of the second driving vibration arm 222.

The driving output electrode 32 is provided in the driving vibration arms 220 and 222. In the illustrated example, the driving output electrode 32 is provided on the main surfaces 2*a* and 2*b* of the first driving vibration arm 220 and the side surface 3 of the second driving vibration arm 222.

The first detection electrode 40 is provided in the detection vibration arm 232. In the illustrated example, the first detection electrode 40 is provided on the main surfaces 2*a* and 2*b* and the side surface 3 of the second detection vibration arm 232.

The second detection electrode 42 is provided in the detection vibration arm 232. In the illustrated example, the second detection electrode 42 is provided on the main surfaces 2*a* and 2*b* and the side surface 3 of the second detection vibration arm 232.

The third detection electrode 44 is provided in the detection vibration arm 230. In the illustrated example, the third detection electrode 44 is provided on the main surfaces 2*a* and 2*b* and the side surface 3 of the first detection vibration arm 230.

The fourth detection electrode 46 is provided in the detection vibration arm 230. In the illustrated example, the fourth detection electrode 46 is provided on the main surfaces 2*a* and 2*b* and the side surface 3 of the first detection vibration arm 230.

In the present embodiment, as shown in FIG. 12, grooves are provided on the main surfaces 2*a* and 2*b* of the vibrating arms 230 and 232, and the cross-section of each of the vibrating arms 230 and 232 is an H shape. The electrodes 40, 42, 44, and 46 are provided inside the grooves and on the side surface 3. Although not shown, grooves may also be provided on the main surfaces 2*a* and 2*b* of the vibrating arms 220 and 222, and the electrodes 30 and 32 may be provided inside the grooves.

The driving input wiring line 50 is provided in the base 10, the support portion 240, and the third beam portion 254. The driving input wiring line 50 has a terminal portion 50*a* in the support portion 240, and the terminal portion 50*a* and the driving input electrode 30 are connected to each other.

The driving output wiring line 52 is provided in the base 10, the support portion 240, and the fourth beam portion 256. The driving output wiring line 52 has a terminal portion 52*a* in the support portion 240, and the terminal portion 52*a* and the driving output electrode 32 are connected to each other.

The first detection wiring line 60 is provided in the base 10, the support portion 240, and the second beam portion 252. In the illustrated example, the first detection wiring line 60 is also provided in the wide portion 5. The first detection wiring line 60 has a terminal portion 60*a* in the support portion 240, and connects the terminal portion 60*a* to the first and fourth detection electrodes 40 and 46.

The second detection wiring line 62 is provided in the base 10, the support portion 240, and the first beam portion 250. In the illustrated example, the second detection wiring line 62 is also provided in the wide portion 5. The second detection wiring line 62 has a terminal portion 62*a* in the support portion 240, and connects the terminal portion 62a to the second and third detection electrodes 42 and 44.

The fixed potential wiring line 70 is provided in the base 10, the support portion 240, and the beam portions 250, 252, 254, and 256. In the illustrated example, the fixed potential wiring line 70 is also provided in the wide portion 5.

In FIGS. 10 and 11, the electrodes 30, 32, 40, 42, 44, and 46 and the wiring lines 50, 52, 60, 62, and 70 provided on the side surface 3 of the vibrating reed 1 are indicated by thick lines.

Figure 13A:
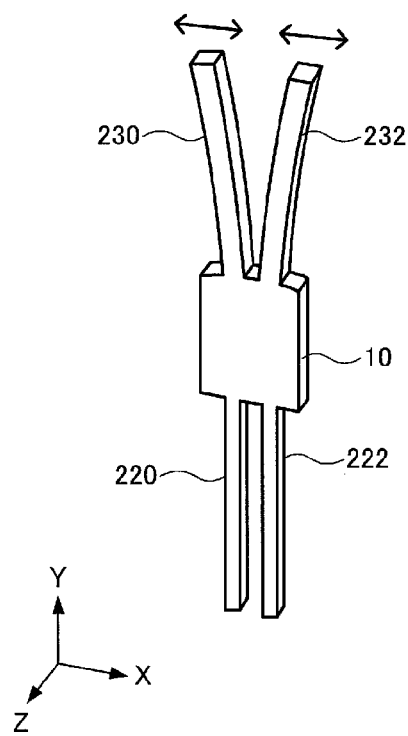
FIGS. 13A and 13B are perspective views for explaining the operation of the vibrating element according to the third embodiment.
Figure 13B:
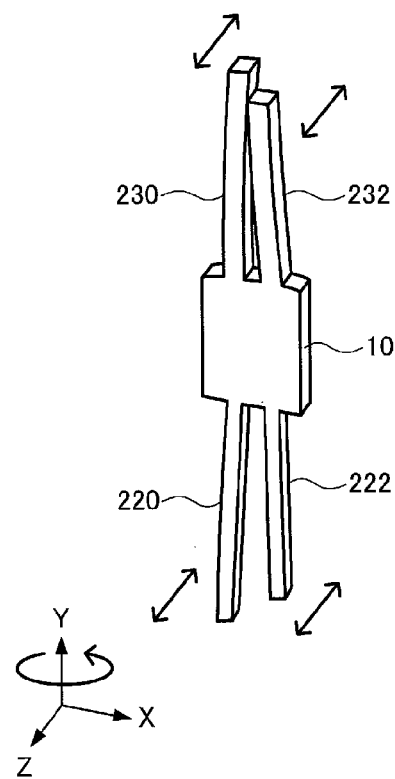

Next, the operation of the vibrating element 100 will be described. FIGS. 13A and 13B are perspective views for explaining the operation of the vibrating element 100. For the sake of convenience, members other than the base 10 and the vibrating arms 220, 222, 230, and 232 are not shown in FIGS. 13A and 13B.

As shown in FIG. 13A, in the vibrating element 100, when a predetermined AC voltage is applied to the driving input electrode 30 provided in each of the driving vibration arms 220 and 222 in a state where no angular velocity is applied, the driving vibration arms 220 and 222 perform bending vibrations in opposite directions within the XY plane (driving mode).

When an angular velocity around the Y axis is applied to the vibrating element 100 in a state where the driving vibration arms 220 and 222 perform such driving vibrations, Coriolis force corresponding to the angular velocity acts on the driving vibration arms 220 and 222 and accordingly the driving vibration arms 220 and 222 perform bending vibrations in opposite directions in the Z-axis direction. Resonating to the bending vibrations, the detection vibration arms 230 and 232 perform bending vibrations in opposite directions in the Z-axis direction (detection mode). By the vibrations (bending vibrations) of the detection vibration arms 230 and 232, the first detection signal, the second detection signal, the third detection signal, and the fourth detection signal are generated in the first detection electrode 40, the second detection electrode 42, the third detection electrode 44, and the fourth detection electrode 46, respectively.

In this case, the first and second detection signals have opposite electrical polarities, and the third and fourth detection signals have opposite electrical polarities. In addition, the first and fourth detection signals have the same electrical polarity, and the second and third detection signals have the same electrical polarity. For example, negative charge δ− is generated in the second and third detection electrodes 42 and 44 when positive charge δ+ is generated in the first and fourth detection electrodes 40 and 46, and positive charge δ+ is generated in the second and third detection electrodes 42 and 44 when negative charge δ− is generated in the first and fourth detection electrodes 40 and 46. The first and fourth detection signals are output to the detection circuit 450 from the terminal portion 60a and the second and third detection signals are output to the detection circuit 450 from the terminal portion 62a, and the detection circuit 450 can calculate an angular velocity around the Y axis with these detection signals.

As shown in FIG. 12, in the physical quantity detecting device 400 according to the present embodiment, the terminal portion 60a of the vibrating element 100 is connected to the inverting input terminal (− terminal) of the operational amplifier provided in the charge amplifier 451. Accordingly, the input signal of the charge amplifier 451 is a signal obtained by adding the first and fourth detection signals. Since the first and fourth detection signals have the same electrical polarity (the same phase), the amplitude of the input signal of the charge amplifier 451 is almost equal to the sum of the amplitude of the first detection signal and the amplitude of the fourth detection signal.

Similarly, the terminal portion 62a of the vibrating element 100 is connected to the inverting input terminal (− terminal) of the operational amplifier provided in the charge amplifier 452. Accordingly, the input signal of the charge amplifier 452 is a signal obtained by adding the second and third detection signals. Since the second and third detection signals have the same electrical polarity (the same phase), the amplitude of the input signal of the charge amplifier 452 is almost equal to the sum of the amplitude of the second detection signal and the amplitude of the third detection signal.

In addition, the sum signal of the first and fourth detection signals (that is, the input signal of the charge amplifier 451) and the sum signal of the second and third detection signals (that is, the input signal of the charge amplifier 452) have opposite electrical polarities (opposite phases). Therefore, according to the physical quantity detecting device 400 of the present embodiment, a fixed potential is supplied to the second and fourth detection electrodes 42 and 46, and only the first detection signal is input to the charge amplifier 451. For this reason, compared with a known physical quantity detecting device in which only the third detection signal is input to the charge amplifier 452, if the structure of the vibrating element 100 is the same, the amount of charges (the amount of current) input to the detection circuit 450 when the vibrating element 100 detects the same angular velocity is increased. Accordingly, the element sensitivity (angular velocity detection sensitivity) of the vibrating element 100 is improved. Therefore, according to the present embodiment, it is possible to realize the highly accurate and highly stable physical quantity detecting device 400. If the element sensitivity of a known vibrating element is sufficient as the element sensitivity of the vibrating element 100, it is possible to increase the detuning frequency Δf by the amount. As a result, it is possible to realize the highly reliable physical quantity detecting device 400.

In the physical quantity detecting device 400 according to the present embodiment, since the terminal portion 60a and the first and fourth detection electrodes 40 and 46 are connected to each other by the first detection wiring line 60 and the terminal portion 62a and the second and third detection electrodes 42 and 44 are connected to each other by the second detection wiring line 62, the terminal portion 64a connected to the third detection electrode 44 and the terminal portion 66a connected to the fourth detection electrode 46 in the first or second embodiment are not required. Therefore, according to the physical quantity detecting device 400 of the present embodiment, an external member such as a bonding wire for connecting the terminal portions 64a and 66a of the vibrating element 100 to the detection circuit 450 required in the first or second embodiment (or an external member for connecting the terminal portions 60a and 66a to each other and an external member for connecting the terminal portions 62a and 64a to each other) are not required. For this reason, it is possible to realize cost reduction.

Also in the present embodiment, since the first and fourth detection electrodes 40 and 46 are connected to the inverting input terminal (− terminal) of the operational amplifier provided in the charge amplifier 451, the first and fourth detection electrodes 40 and 46 are virtually short-circuited to the non-inverting input terminal (+ terminal) of the operational amplifier. Accordingly, the first and fourth detection electrodes 40 and 46 always have a reference potential.

Similarly, the second and third detection electrodes 42 and 44 are connected to the inverting input terminal (− terminal) of the operational amplifier provided in the charge amplifier 452. Accordingly, since the second and third detection electrodes 42 and 44 are virtually short-circuited to the non-inverting input terminal (+ terminal) of the operational amplifier. Accordingly, the second and third detection electrodes 42 and 44 always have a reference potential. That is, in the present embodiment, the first detection electrode 40, the second detection electrode 42, the third detection electrode 44, and the fourth detection electrode 46 always have the same electric potential, and accordingly, no electric field is generated between the electrodes.

Modification Examples

In the physical quantity detecting device 400 according to the third embodiment, the first and second detection vibration arms 230 and 232 in the vibrating element 100 have H-shaped cross-sections. However, the first and second detection vibration arms 230 and 232 may have cross-sections of other shapes. In addition, electrodes formed in the first and second detection vibration arms 230 and 232 may be arranged in different ways.

Figure 14:
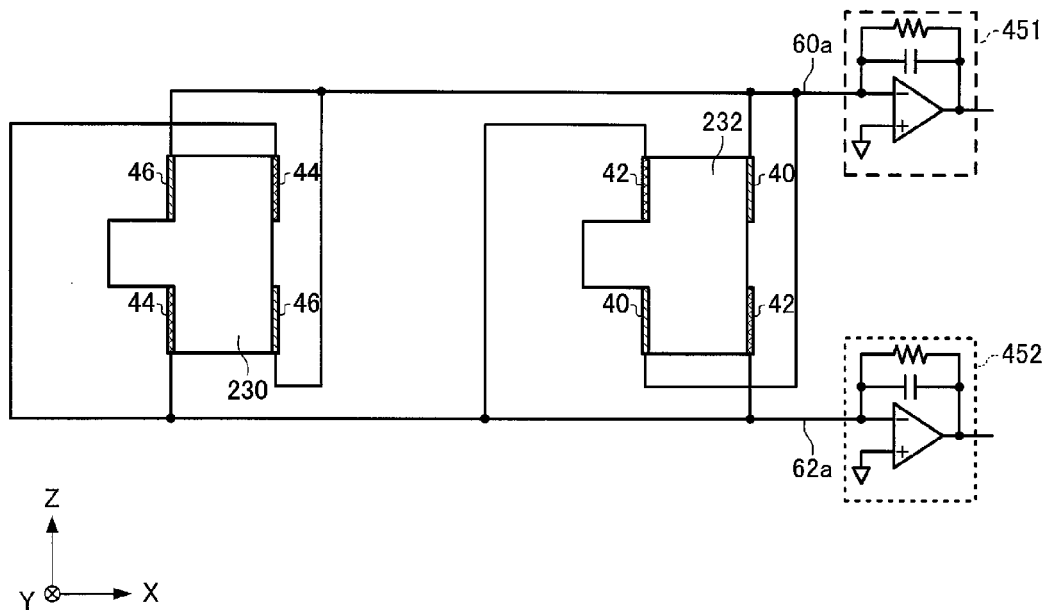
FIG. 14 is a cross-sectional view schematically showing a vibrating element according to a first modification example of the third embodiment.

For example, as shown in FIG. 14, in the vibrating element 100 provided in the physical quantity detecting device 400 according to a first modification example of the third embodiment, in the second detection vibration arm 232, the first detection electrode 40 formed on the first main surface 2a side and the second detection electrode 42 formed on the second main surface 2b side are provided on the side surface 3 facing the +X-axis direction, and the second detection electrode 42 formed on the first main surface 2a side and the first detection electrode 40 formed on the second main surface 2b side are provided on the side surface 3 facing the −X-axis direction. In addition, the first detection electrode 40 provided on the side surface 3 facing the +X-axis direction and the second detection electrode 42 provided on the side surface 3 facing the −X-axis direction are provided so as to face each other with the second detection vibration arm 232 interposed therebetween, and the second detection electrode 42 provided on the side surface 3 facing the +X-axis direction and the first detection electrode 40 provided on the side surface 3 facing the −X-axis direction are provided so as to face each other with the second detection vibration arm 232 interposed therebetween. In addition, a protruding portion having a rectangular cross-section is provided between the first and second detection electrodes 40 and 42 provided on the side surface 3 facing the −X-axis direction.

Similarly, in the first detection vibration arm 230, the third detection electrode 44 formed on the first main surface 2a side and the fourth detection electrode 46 formed on the second main surface 2b side are provided on the side surface 3 facing the +X-axis direction, and the fourth detection electrode 46 formed on the first main surface 2a side and the third detection electrode 44 formed on the second main surface 2b side are provided on the side surface 3 facing the −X-axis direction. In addition, the third detection electrode 44 provided on the side surface 3 facing the +X-axis direction and the fourth detection electrode 46 provided on the side surface 3 facing the −X-axis direction are provided so as to face each other with the first detection vibration arm 230 interposed therebetween, and the fourth detection electrode 46 provided on the side surface 3 facing the +X-axis direction and the third detection electrode 44 provided on the side surface 3 facing the −X-axis direction are provided so as to face each other with the first detection vibration arm 230 interposed therebetween. In addition, a protruding portion having a rectangular cross-section is provided between the third and fourth detection electrodes 44 and 46 provided on the side surface 3 facing the −X-axis direction.

Figure 15:
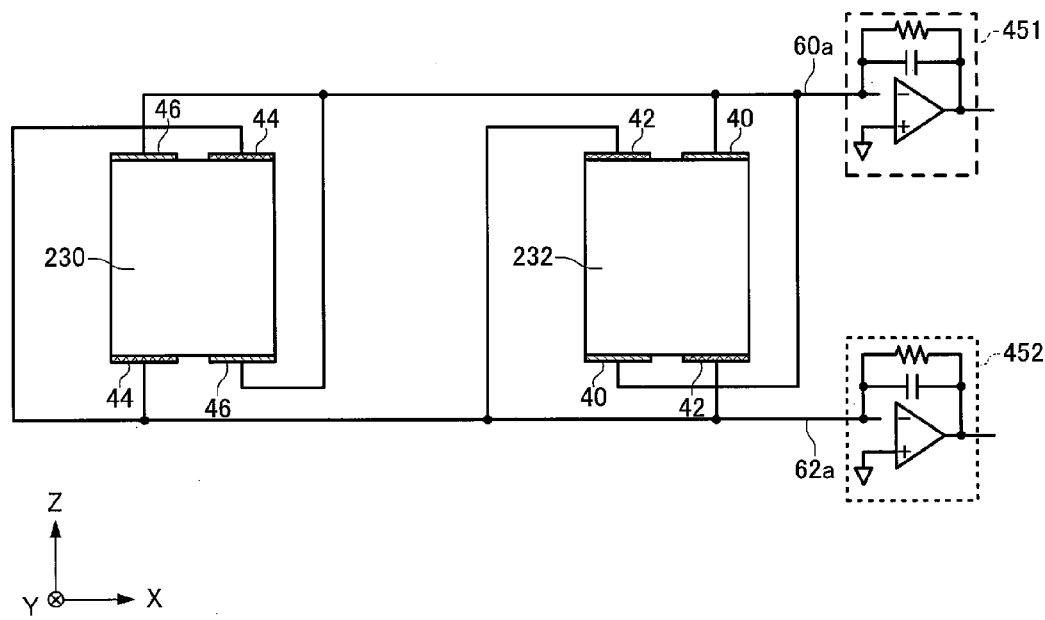
FIG. 15 is a cross-sectional view schematically showing a vibrating element according to a second modification example of the third embodiment.

For example, as shown in FIG. 15, in the vibrating element 100 provided in the physical quantity detecting device 400 according to a second modification example of the third embodiment, the second detection vibration arm 232 has a rectangular cross-section. In addition, the first detection electrode 40 formed on the side surface 3 facing the +X-axis direction and the second detection electrode 42 formed on the side surface 3 facing the −X-axis direction are provided on the first main surface 2a, and the second detection electrode 42 formed on the side surface 3 facing the +X-axis direction and the first detection electrode 40 formed on the side surface 3 facing the −X-axis direction are provided on the second main surface 2b. In addition, the first detection electrode 40 provided on the first main surface 2a and the second detection electrode 42 provided on the second main surface 2b are provided so as to face each other with the second detection vibration arm 232 interposed therebetween, and the second detection electrode 42 provided on the first main surface 2a and the first detection electrode 40 provided on the second main surface 2b are provided so as to face each other with the second detection vibration arm 232 interposed therebetween.

Similarly, the first detection vibration arm 230 has a rectangular cross-section. In addition, the third detection electrode 44 formed on the side surface 3 facing the +X-axis direction and the fourth detection electrode 46 formed on the side surface 3 facing the −X-axis direction are provided on the first main surface 2a, and the fourth detection electrode 46 formed on the side surface 3 facing the +X-axis direction and the third detection electrode 44 formed on the side surface 3 facing the −X-axis direction are provided on the second main surface 2b. In addition, the third detection electrode 44 provided on the first main surface 2a and the fourth detection electrode 46 provided on the second main surface 2b are provided so as to face each other with the first detection vibration arm 230 interposed therebetween, and the fourth detection electrode 46 provided on the first main surface 2a and the third detection electrode 44 provided on the second main surface 2b are provided so as to face each other with the first detection vibration arm 230 interposed therebetween.

Figure 16:
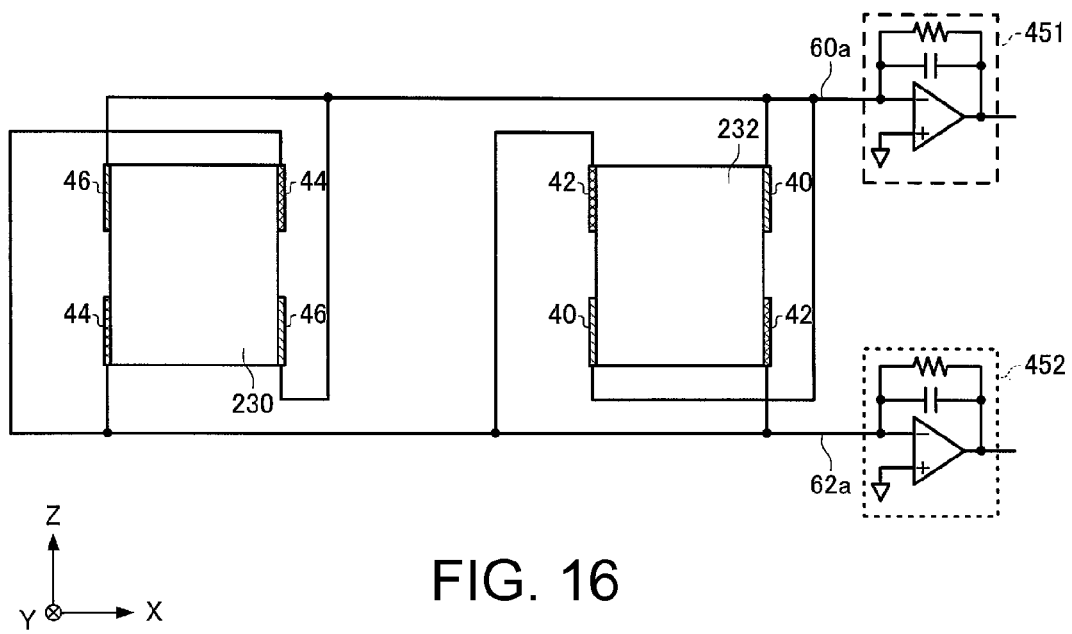
FIG. 16 is a cross-sectional view schematically showing a vibrating element according to a third modification example of the third embodiment.

For example, as shown in FIG. 16, in the vibrating element 100 provided in the physical quantity detecting device 400 according to a third modification example of the third embodiment, the second detection vibration arm 232 has a rectangular cross-section. In addition, the first detection electrode 40 formed on the first main surface 2a side and the second detection electrode 42 formed on the second main surface 2b side are provided on the side surface 3 facing the +X-axis direction, and the second detection electrode 42 formed on the first main surface 2a side and the first detection electrode 40 formed on the second main surface 2b side are provided on the side surface 3 facing the −X-axis direction. In addition, the first detection electrode 40 provided on the side surface facing the +X-axis direction and the second detection electrode 42 provided on the side surface 3 facing the −X-axis direction are provided so as to face each other with the second detection vibration arm 232 interposed therebetween, and the second detection electrode 42 provided on the side surface 3 facing the +X-axis direction and the first detection electrode 40 provided on the side surface 3 facing the −X-axis direction are provided so as to face each other with the second detection vibration arm 232 interposed therebetween.

Similarly, the first detection vibration arm 230 has a rectangular cross-section. In addition, the third detection electrode 44 formed on the first main surface 2a side and the fourth detection electrode 46 formed on the second main surface 2b side are provided on the side surface 3 facing the +X-axis direction, and the fourth detection electrode 46 formed on the first main surface 2a side and the third detection electrode 44 formed on the second main surface 2b side are provided on the side surface 3 facing the −X-axis direction. In addition, the third detection electrode 44 provided on the side surface facing the +X-axis direction and the fourth detection electrode 46 provided on the side surface 3 facing the −X-axis direction are provided so as to face each other with the first detection vibration arm 230 interposed therebetween, and the fourth detection electrode 46 provided on the side surface 3 facing the +X-axis direction and the third detection electrode 44 provided on the side surface 3 facing the −X-axis direction are provided so as to face each other with the first detection vibration arm 230 interposed therebetween.

Also in the physical quantity detecting device 400 according to each of the first to third modification examples of the third embodiment, the first detection signal generated in the first detection electrode 40 and the second detection signal generated in the second detection electrode 42 have opposite electrical polarities, and the third detection signal generated in the third detection electrode 44 and the fourth detection signal generated in the fourth detection electrode 46 have opposite electrical polarities. In addition, the first and fourth detection signals have the same electrical polarity, and the second and third detection signals have the same electrical polarity. Therefore, also in the physical quantity detecting device 400 according to each of the first to third modification examples of the third embodiment, compared with a known physical quantity detecting device, if the structure of the vibrating element 100 is the same, the amount of charges (the amount of current) input to the detection circuit 450 when the vibrating element 100 detects the same angular velocity is increased. As a result, the angular velocity detection sensitivity is improved.

1-4. Fourth Embodiment

In a physical quantity detecting device 400 according to a fourth embodiment, the structure of the vibrating element 100 is different from that in the first to third embodiments. Since the functional block diagram of the physical quantity detecting device according to the fourth embodiment is the same as that shown in FIG. 1, illustration and explanation thereof will be omitted.

Figure 17:
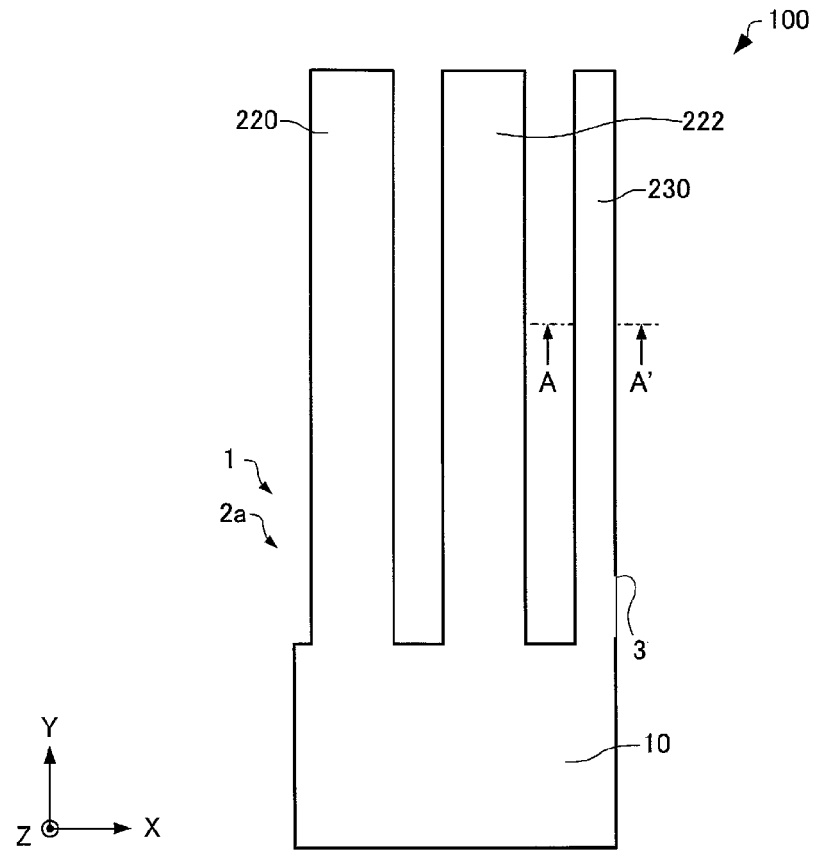
FIG. 17 is a plan view schematically showing a vibrating element according to a fourth embodiment.
Figure 18:
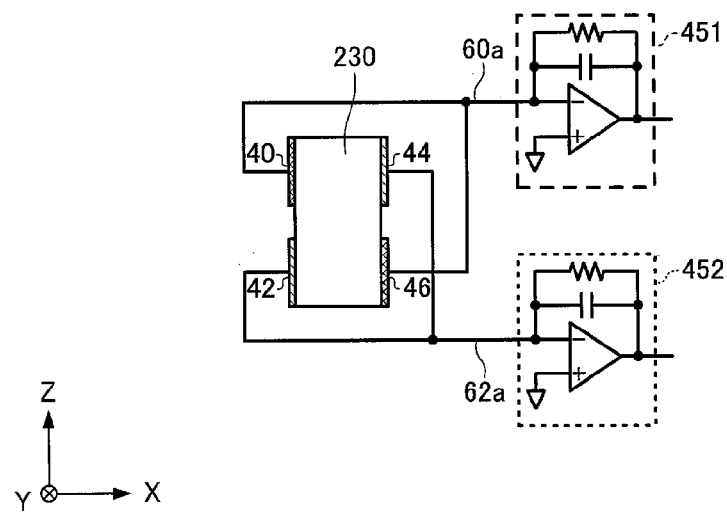
FIG. 18 is a cross-sectional view schematically showing the vibrating element according to the fourth embodiment.

Next, the vibrating element 100 according to the fourth embodiment will be described with reference to the accompanying diagrams. FIG. 17 is a plan view schematically showing the vibrating element 100 according to the fourth embodiment. FIG. 18 is a cross-sectional view taken along the line A-A' of FIG. 17, which schematically shows the vibrating element 100 according to the fourth embodiment. For the sake of convenience, FIG. 18 also shows the connection relationship between the vibrating element 100 and the charge amplifiers 451 and 452. In addition, FIG. 17 is a diagram when the vibrating element 100 is viewed from the first main surface 2a side, and wiring lines formed in the vibrating reed 1 are not shown.

Hereinafter, in the vibrating element 100 according to the fourth embodiment, components having the same functions as the components of the vibrating element 100 according to the first embodiment described above are denoted by the same reference numerals, and detailed explanation thereof will be omitted.

In the vibrating element 100 according to the fourth embodiment, as shown in FIGS. 17 to 18, the vibrating reed 1 is a so-called tripod type vibrating reed.

As shown in FIGS. 17 to 18, the vibrating reed 1 includes the base 10, the driving vibration arms 220 and 222, and the detection vibration arm 230. The first driving vibration arm 220, the second driving vibration arm 222, and the detection vibration arm 230 are disposed side by side along the X axis, and extend along the Y axis from the base 10.

As shown in FIG. 18, in the vibrating element 100 provided in the physical quantity detecting device 400 according to the fourth embodiment, the detection vibration arm 230 has a rectangular cross-section. In addition, the first detection electrode 40 formed on the first main surface 2a side and the second detection electrode 42 formed on the second main surface 2b side are provided on the side surface facing the −X-axis direction, and the third detection electrode 44 formed on the first main surface 2a side and the fourth detection electrode 46 formed on the second main surface 2b side are provided on the side surface 3 facing the +X-axis direction. In addition, the first detection electrode 40 provided on the side surface 3 facing the −X-axis direction and the third detection electrode 44 provided on the side surface 3 facing the +X-axis direction are provided so as to face each other with the detection vibration arm 230 interposed therebetween, and the second detection electrode 42 provided on the side surface 3 facing the −X-axis direction and the fourth detection electrode 46 provided on the side surface 3 facing the +X-axis direction are provided so as to face each other with the detection vibration arm 230 interposed therebetween.

In the vibrating element 100, when a predetermined AC voltage is applied to the driving input electrode 30 (not shown) provided in each of the driving vibration arms 220 and 222 in a state where no angular velocity is applied, the driving vibration arms 220 and 222 perform bending vibrations in opposite directions within the XY plane (driving mode).

When an angular velocity around the Y axis is applied to the vibrating element 100 in a state where the driving vibration arms 220 and 222 perform such driving vibrations, Coriolis force corresponding to the angular velocity acts on the driving vibration arms 220 and 222 and accordingly the driving vibration arms 220 and 222 perform bending vibrations in opposite directions in the Z-axis direction. Resonating to the bending vibrations, the detection vibration arm 230 performs a bending vibration in the Z-axis direction (detection mode). By the vibration (bending vibrations) of the detection vibration arm 230, the first detection signal, the second detection signal, the third detection signal, and the fourth detection signal are generated in the first detection electrode 40, the second detection electrode 42, the third detection electrode 44, and the fourth detection electrode 46, respectively.

In this case, the first and second detection signals have opposite electrical polarities, and the third and fourth detection signals have opposite electrical polarities. In addition, the first and fourth detection signals have the same electrical polarity, and the second and third detection signals have the same electrical polarity. For example, negative charge δ− is generated in the second and third detection electrodes 42 and 44 when positive charge δ+ is generated in the first and fourth detection electrodes 40 and 46, and positive charge δ+ is generated in the second and third detection electrodes 42 and 44 when negative charge δ− is generated in the first and fourth detection electrodes 40 and 46. The first and fourth detection signals are output to the detection circuit 450 from the terminal portion 60a and the second and third detection signals are output to the detection circuit 450 from the terminal portion 62a, and the detection circuit 450 can calculate an angular velocity around the Y axis with these detection signals.

As shown in FIG. 18, in the physical quantity detecting device 400 according to the present embodiment, the terminal portion 60a to which the first and fourth detection electrodes 40 and 46 of the vibrating element 100 are connected is connected to the inverting input terminal (− terminal) of the operational amplifier provided in the charge amplifier 451. Accordingly, the input signal of the charge amplifier 451 is a signal obtained by adding the first and fourth detection signals. Since the first and fourth detection signals have the same electrical polarity (the same phase), the amplitude of the input signal of the charge amplifier 451 is almost equal to the sum of the amplitude of the first detection signal and the amplitude of the fourth detection signal.

Similarly, the terminal portion 62a to which the second and third detection electrodes 42 and 44 of the vibrating element 100 are connected is connected to the inverting input terminal (− terminal) of the operational amplifier provided in the charge amplifier 452. Accordingly, the input signal of the charge amplifier 452 is a signal obtained by adding the second and third detection signals. Since the second and third detection signals have the same electrical polarity (the same phase), the amplitude of the input signal of the charge amplifier 452 is almost equal to the sum of the amplitude of the second detection signal and the amplitude of the third detection signal.

In addition, the sum signal of the first and fourth detection signals (that is, the input signal of the charge amplifier 451) and the sum signal of the second and third detection signals (that is, the input signal of the charge amplifier 452) have opposite electrical polarities (opposite phases). Therefore, according to the physical quantity detecting device 400 of the present embodiment, a fixed potential is supplied to the second and fourth detection electrodes 42 and 46, and only the first detection signal is input to the charge amplifier 451. For this reason, compared with a known physical quantity detecting device in which only the third detection signal is input to the charge amplifier 452, if the structure of the vibrating element 100 is the same, the amount of charges (the amount of current) input to the detection circuit 450 when the vibrating element 100 detects the same angular velocity is increased. Accordingly, the element sensitivity (angular velocity detection sensitivity) of the vibrating element 100 is improved. Therefore, according to the present embodiment, it is possible to realize the highly accurate and highly stable physical quantity detecting device 400. If the element sensitivity of a known vibrating element is sufficient as the element sensitivity of the vibrating element 100, it is possible to increase the detuning frequency Δf by the amount. As a result, it is possible to realize the highly reliable physical quantity detecting device 400.

Also in the present embodiment, since the first and fourth detection electrodes 40 and 46 are connected to the inverting input terminal (− terminal) of the operational amplifier provided in the charge amplifier 451, the first and fourth detection electrodes 40 and 46 are virtually short-circuited to the non-inverting input terminal (+ terminal) of the operational amplifier. Accordingly, the first and fourth detection electrodes 40 and 46 always have a reference potential. Similarly, the second and third detection electrodes 42 and 44 are connected to the inverting input terminal (− terminal) of the operational amplifier provided in the charge amplifier 452. Accordingly, since the second and third detection electrodes 42 and 44 are virtually short-circuited to the non-inverting input terminal (+ terminal) of the operational amplifier. Accordingly, the second and third detection electrodes 42 and 44 always have a reference potential. That is, in the present embodiment, the first detection electrode 40, the second detection electrode 42, the third detection electrode 44, and the fourth detection electrode 46 always have the same electric potential, and accordingly, no electric field is generated between the electrodes.

1-5. Fifth Embodiment

In a physical quantity detecting device 400 according to a fifth embodiment, the structure of the vibrating element 100 is different from that in the first to fourth embodiments. Since the functional block diagram of the physical quantity detecting device according to the fifth embodiment is the same as that shown in FIG. 1, illustration and explanation thereof will be omitted.

Figure 19:
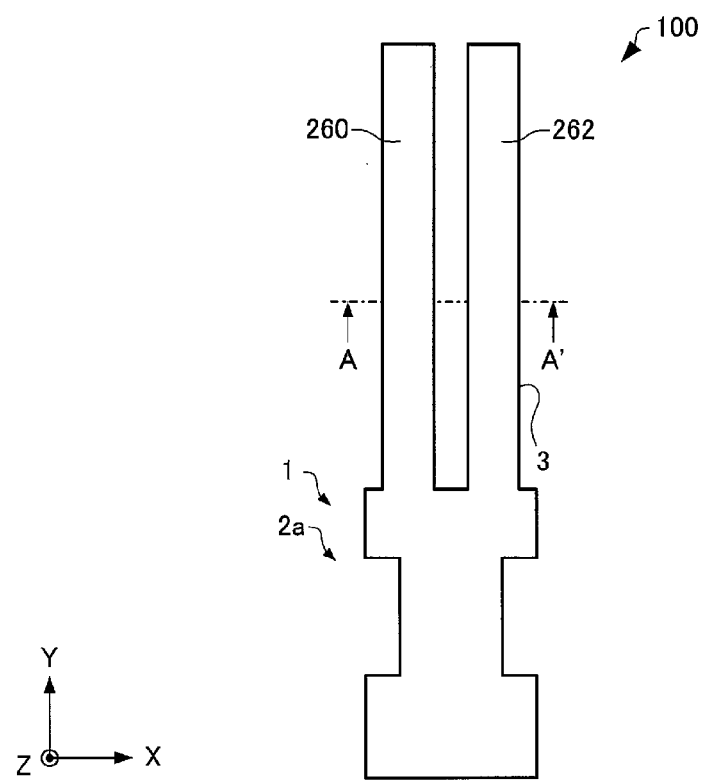
FIG. 19 is a plan view schematically showing a vibrating element according to a fifth embodiment.
Figure 20:
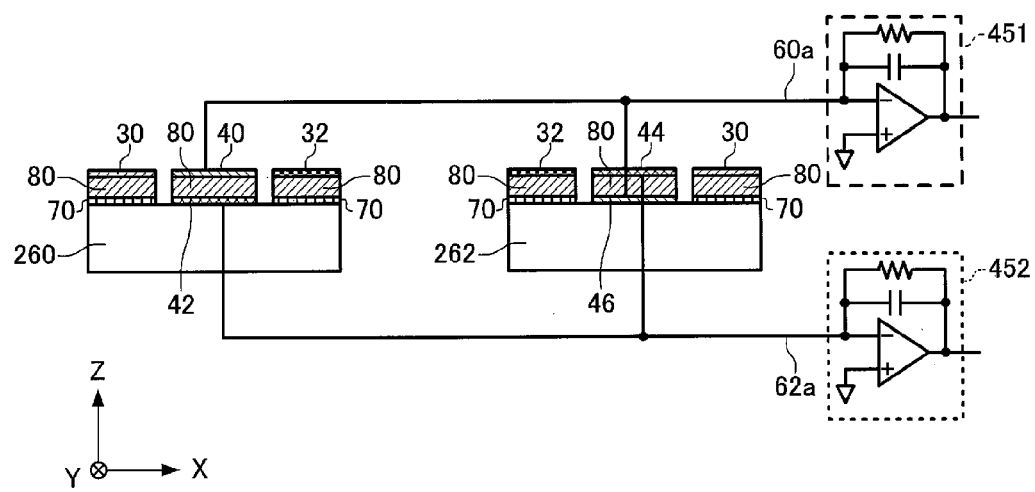
FIG. 20 is a cross-sectional view schematically showing the vibrating element according to the fifth embodiment.

Next, the vibrating element 100 according to the fifth embodiment will be described with reference to the accompanying diagrams. FIG. 19 is a plan view schematically showing the vibrating element 100 according to the fifth embodiment. FIG. 20 is a cross-sectional view taken along the line A-A' of FIG. 19, which schematically shows the vibrating element 100 according to the fifth embodiment. For the sake of convenience, FIG. 20 also shows the connection relationship between the vibrating element 100 and the charge amplifiers 451 and 452. In addition, FIG. 19 is a diagram when the vibrating element 100 is viewed from the first main surface 2a side, and wiring lines formed in the vibrating reed 1 are not shown.

Hereinafter, in the vibrating element 100 according to the fifth embodiment, components having the same functions as the components of the vibrating element 100 according to the first embodiment described above are denoted by the same reference numerals, and detailed explanation thereof will be omitted.

In the vibrating element 100 according to the fifth embodiment, as shown in FIGS. 19 to 20, the vibrating reed 1 is a so-called tuning fork type vibrating reed.

As shown in FIGS. 19 to 20, the vibrating reed 1 includes the base 10 and driving detection vibration arms 260 and 262. The first and second driving detection vibration arms 260 and 262 are disposed side by side along the X axis, and extend along the Y axis from the base 10. The material of the vibrating reed 1 is silicon (Si) or silicon semiconductor, for example.

As shown in FIG. 20, in the vibrating element 100 provided in the physical quantity detecting device 400 according to the fifth embodiment, the first driving detection vibration arm 260 has a rectangular cross-section. On the first main surface 2a, the second detection electrode 42 is provided along the X axis so as to be interposed between the fixed potential wiring lines 70. A piezoelectric film 80 is provided between the driving input electrode 30 and the fixed potential wiring line 70, between the driving output electrode 32 and the fixed potential wiring line 70, and between the first detection electrode 40 and the second detection electrode 42. The material of the piezoelectric film 80 is a zinc oxide (ZnO) or an aluminum nitride (AlN), for example.

Similarly, the second driving detection vibration arm 262 has a rectangular cross-section. On the first main surface 2a, the fourth detection electrode 46 is provided along the X axis so as to be interposed between the fixed potential wiring lines 70. The piezoelectric film 80 is provided between the driving output electrode 32 and the fixed potential wiring line 70, between the driving input electrode 30 and the fixed potential wiring line 70, and between the third detection electrode 44 and the fourth detection electrode 46.

In the vibrating element 100, when a predetermined AC voltage is applied to the driving input electrode 30 provided in each of the driving detection vibration arms 260 and 262 in a state where no angular velocity is applied, the driving detection vibration arms 260 and 262 perform bending vibrations in opposite directions within the XY plane (driving mode).

When an angular velocity around the Y axis is applied to the vibrating element 100 in a state where the driving detection vibration arms 260 and 262 perform such driving vibrations, Coriolis force corresponding to the angular velocity acts on the driving detection vibration arms 260 and 262 and accordingly the driving detection vibration arms 260 and 262 perform bending vibrations in opposite directions in the Z-axis direction (detection mode). By the vibrations (bending vibrations) of the driving detection vibration arms 260 and 262, the first detection signal, the second detection signal, the third detection signal, and the fourth detection signal are generated in the first detection electrode 40, the second detection electrode 42, the third detection electrode 44, and the fourth detection electrode 46, respectively.

In this case, the first and second detection signals have opposite electrical polarities, and the third and fourth detection signals have opposite electrical polarities. In addition, the first and fourth detection signals have the same electrical polarity, and the second and third detection signals have the same electrical polarity. For example, negative charge δ− is generated in the second and third detection electrodes 42 and 44 when positive charge δ+ is generated in the first and fourth detection electrodes 40 and 46, and positive charge δ+ is generated in the second and third detection electrodes 42 and 44 when negative charge δ− is generated in the first and fourth detection electrodes 40 and 46. The first and fourth detection signals are output to the detection circuit 450 from the terminal portion 60a and the second and third detection signals are output to the detection circuit 450 from the terminal portion 62a, and the detection circuit 450 can calculate an angular velocity around the Y axis with these detection signals.

As shown in FIG. 20, in the physical quantity detecting device 400 according to the present embodiment, the terminal portion 60a to which the first and fourth detection electrodes 40 and 46 of the vibrating element 100 are connected is connected to the inverting input terminal (− terminal) of the operational amplifier provided in the charge amplifier 451. Accordingly, the input signal of the charge amplifier 451 is a signal obtained by adding the first and fourth detection signals. Since the first and fourth detection signals have the same electrical polarity (the same phase), the amplitude of the input signal of the charge amplifier 451 is almost equal to the sum of the amplitude of the first detection signal and the amplitude of the fourth detection signal.

Similarly, the terminal portion 62a to which the second and third detection electrodes 42 and 44 of the vibrating element 100 are connected is connected to the inverting input terminal (− terminal) of the operational amplifier provided in the charge amplifier 452. Accordingly, the input signal of the charge amplifier 452 is a signal obtained by adding the second and third detection signals. Since the second and third detection signals have the same electrical polarity (the same phase), the amplitude of the input signal of the charge amplifier 452 is almost equal to the sum of the amplitude of the second detection signal and the amplitude of the third detection signal.

In addition, the sum signal of the first and fourth detection signals (that is, the input signal of the charge amplifier 451) and the sum signal of the second and third detection signals (that is, the input signal of the charge amplifier 452) have opposite electrical polarities (opposite phases). Therefore, according to the physical quantity detecting device 400 of the present embodiment, a fixed potential is supplied to the second and fourth detection electrodes 42 and 46, and only the first detection signal is input to the charge amplifier 451. For this reason, compared with a known physical quantity detecting device in which only the third detection signal is input to the charge amplifier 452, if the structure of the vibrating element 100 is the same, the amount of charges (the amount of current) input to the detection circuit 450 when the vibrating element 100 detects the same angular velocity is increased. Accordingly, the element sensitivity (angular velocity detection sensitivity) of the vibrating element 100 is improved. Therefore, according to the present embodiment, it is possible to realize the highly accurate and highly stable physical quantity detecting device 400. If the element sensitivity of a known vibrating element is sufficient as the element sensitivity of the vibrating element 100, it is possible to increase the detuning frequency Δf by the amount. As a result, it is possible to realize the highly reliable physical quantity detecting device 400.

Also in the present embodiment, since the first and fourth detection electrodes 40 and 46 are connected to the inverting input terminal (− terminal) of the operational amplifier provided in the charge amplifier 451, the first and fourth detection electrodes 40 and 46 are virtually short-circuited to the non-inverting input terminal (+ terminal) of the operational amplifier. Accordingly, the first and fourth detection electrodes 40 and 46 always have a reference potential. Similarly, the second and third detection electrodes 42 and 44 are connected to the inverting input terminal (− terminal) of the operational amplifier provided in the charge amplifier 452. Accordingly, since the second and third detection electrodes 42 and 44 are virtually short-circuited to the non-inverting input terminal (+ terminal) of the operational amplifier. Accordingly, the second and third detection electrodes 42 and 44 always have a reference potential. That is, in the present embodiment, the first detection electrode 40, the second detection electrode 42, the third detection electrode 44, and the fourth detection electrode 46 always have the same electric potential, and accordingly, no electric field is generated between the electrodes.

2. Electronic Apparatus

Next, an electronic apparatus according to the present embodiment will be described with reference to the accompanying diagrams. The electronic apparatus according to the present embodiment includes the physical quantity detecting device according to the invention. An electronic apparatus including the physical quantity detecting device 400 as a physical quantity detecting device according to the invention will be described below.

Figure 21:
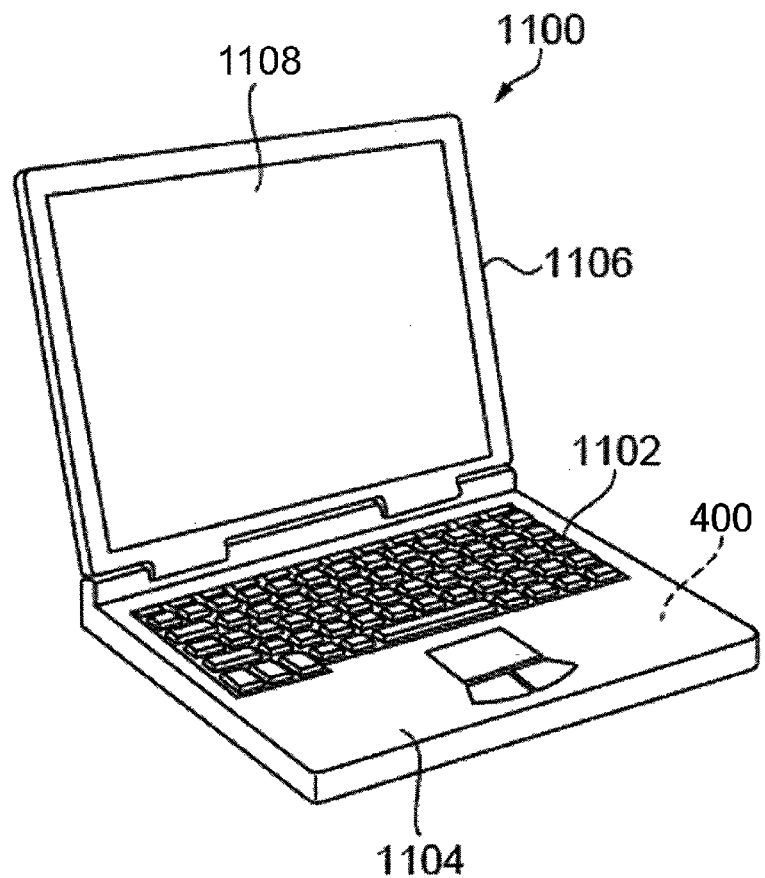
FIG. 21 is a perspective view schematically showing an electronic apparatus according to the present embodiment.

FIG. 21 is a perspective view schematically showing a mobile (or notebook) personal computer 1100 as an electronic apparatus according to the present embodiment.

As shown in FIG. 21, the personal computer 1100 is configured to include a main body 1104 having a keyboard 1102 and a display unit 1106 having a display section 1108, and the display unit 1106 is supported so as to be rotatable with respect to the main body 1104 through a hinge structure.

The physical quantity detecting device 400 is built into the personal computer 1100.

Figure 22:
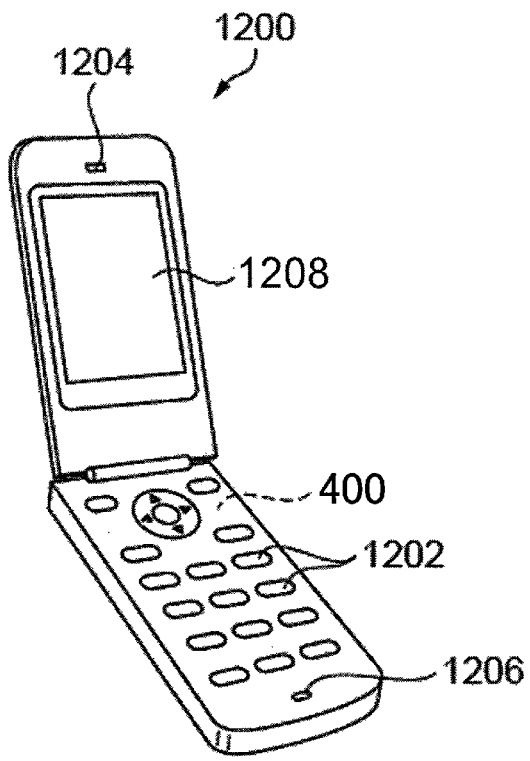
FIG. 22 is a perspective view schematically showing an electronic apparatus according to the present embodiment.

FIG. 22 is a perspective view schematically showing a mobile phone (including a PHS) 1200 as an electronic apparatus according to the present embodiment.

As shown in FIG. 22, the mobile phone 1200 includes a plurality of operation buttons 1202, an earpiece 1204, and a speaker 1206, and a display unit 1208 is disposed between the operation buttons 1202 and the earpiece 1204.

The physical quantity detecting device 400 is built into the mobile phone 1200.

Figure 23:
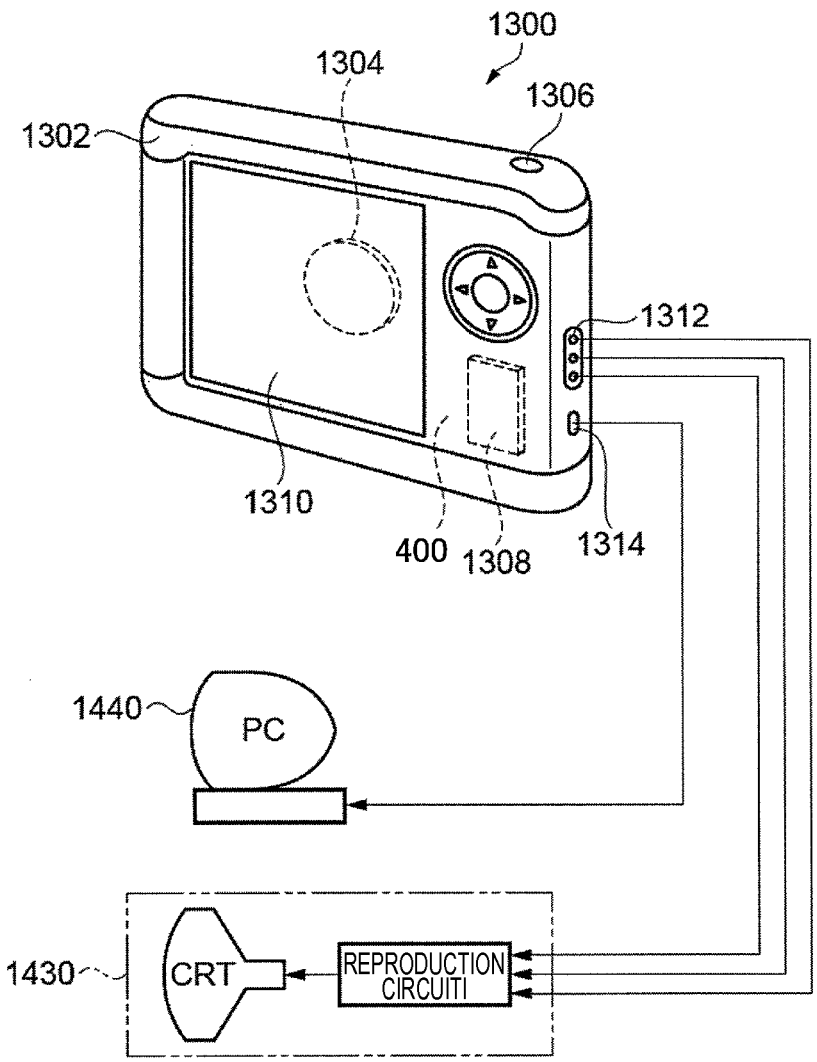
FIG. 23 is a perspective view schematically showing an electronic apparatus according to the present embodiment.

FIG. 23 is a perspective view schematically showing a digital still camera 1300 as an electronic apparatus according to the present embodiment. In addition, FIG. 23 also simply shows a connection with an external apparatus.

While a silver halide photograph film is exposed to light according to an optical image of a subject in a typical camera, the digital still camera 1300 generates an imaging signal (image signal) by performing photoelectric conversion of the optical image of the subject using an imaging device, such as a charge coupled device (CCD).

A display unit 1310 is provided on the back of a case (body) 1302 in the digital still camera 1300, so that display based on the imaging signal of the CCD is performed. The display unit 1310 functions as a viewfinder to display the subject as an electronic image.

In addition, a light receiving unit 1304 including an optical lens (imaging optical system), a CCD, and the like is provided on the front side (back side in the diagram) of the case 1302.

When a photographer checks a subject image displayed on the display unit 1310 and presses a shutter button 1306, an imaging signal of the CCD at that time is transferred and stored in a memory 1308.

In the digital still camera 1300, a video signal output terminal 1312 and an input and output terminal for data communication 1314 are provided on the side of the case 1302. If necessary, a television monitor 1430 is connected to the video signal output terminal 1312, and a personal computer 1440 is connected to the input and output terminal for data communication 1314. In addition, an imaging signal stored in the memory 1308 may be output to the television monitor 1430 or the personal computer 1440 through a predetermined operation.

The physical quantity detecting device 400 is built into the digital still camera 1300.

In addition, examples of the electronic apparatus including the above-described physical quantity detecting device 400 include not only the personal computer (mobile personal computer) shown in FIG. 21, the mobile phone shown in FIG. 22, and the digital still camera shown in FIG. 23 but also an ink jet type discharge apparatus (for example, an ink jet printer), a laptop type personal computer, a television, a video camera, a video tape recorder, various navigation apparatuses, a pager, an electronic diary (electronic diary with a communication function is also included), an electronic dictionary, an electronic calculator, an electronic game machine, a head-mounted display, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for vehicles, aircraft, rockets, and ships), posture control of a robot, a human body, and the like, and a flight simulator.

The electronic apparatus according to the present embodiment includes the physical quantity detecting device 400 with high detection sensitivity. Therefore, the electronic apparatus according to the present embodiment can have good characteristics.

3. Moving Object

Next, a moving object according to the present embodiment will be described with reference to the accompanying diagrams. The moving object according to the present embodiment includes the physical quantity detecting device according to the invention. A moving object including the physical quantity detecting device 400 as a physical quantity detecting device according to the invention will be described below.

Figure 24:
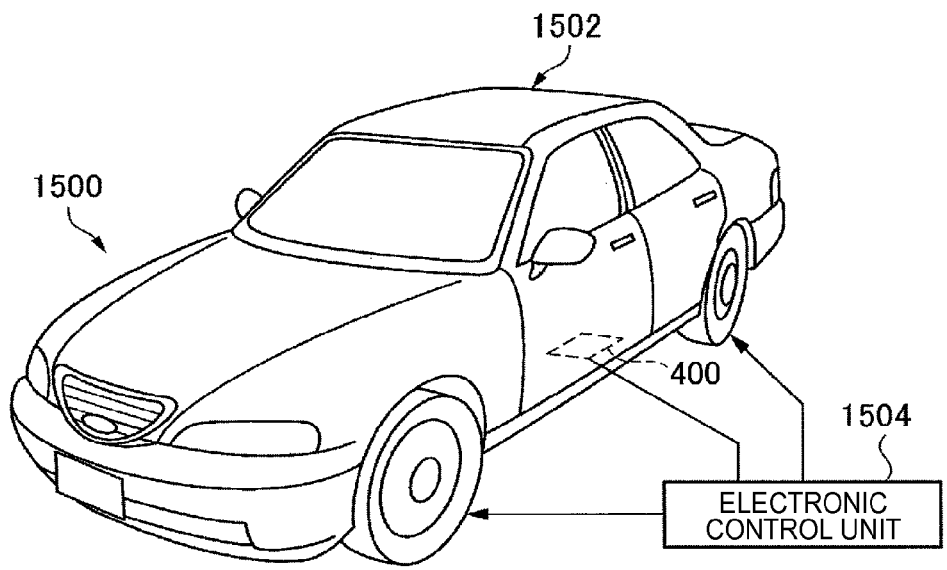
FIG. 24 is a perspective view schematically showing a moving object according to the present embodiment.

FIG. 24 is a perspective view schematically showing an automobile 1500 as a moving object according to the present embodiment.

The physical quantity detecting device 400 is built into the automobile 1500. Specifically, as shown in FIG. 24, specifically, an electronic control unit (ECU) 1504 that includes the vibrating element 100 for detecting the angular velocity of the automobile 1500 and controls the output of the engine is mounted in a body 1502 of the automobile 1500. In addition, the physical quantity detecting device 400 can be widely applied to a vehicle body posture control unit, an anti-lock brake system (ABS), an air bag, and a tire pressure monitoring system (TPMS).

The moving object according to the present embodiment includes the physical quantity detecting device 400 with high detection sensitivity. Therefore, the moving object according to the present embodiment can have good characteristics.

The invention is not limited to the present embodiment, and can be modified within the scope of the invention.

Figure 25:
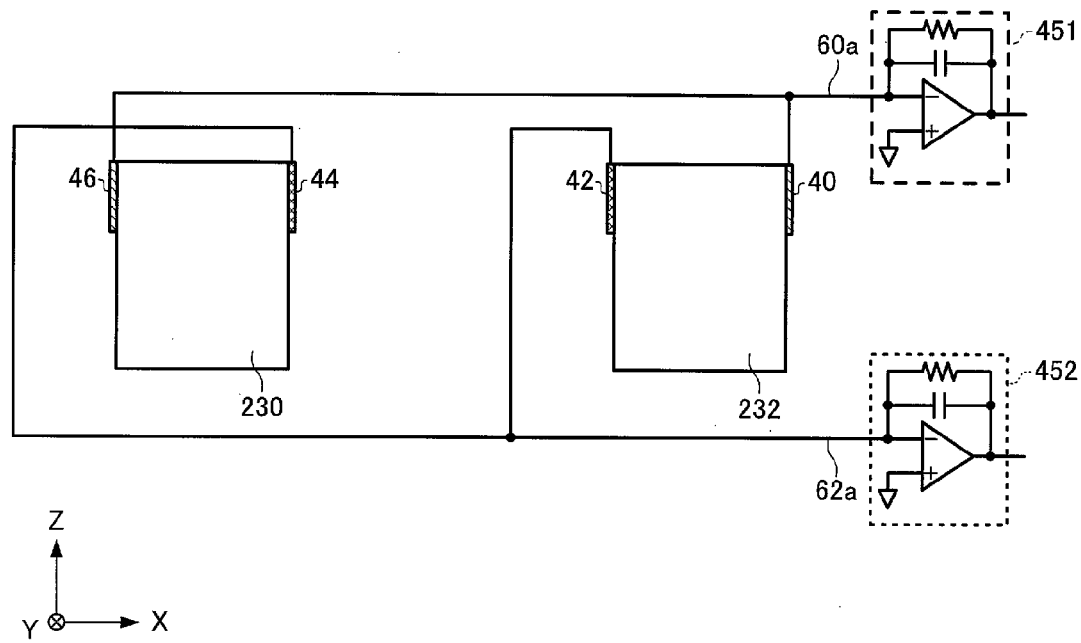
FIG. 25 is a cross-sectional view schematically showing a vibrating element according to a modification example of the present embodiment.
Figure 26:
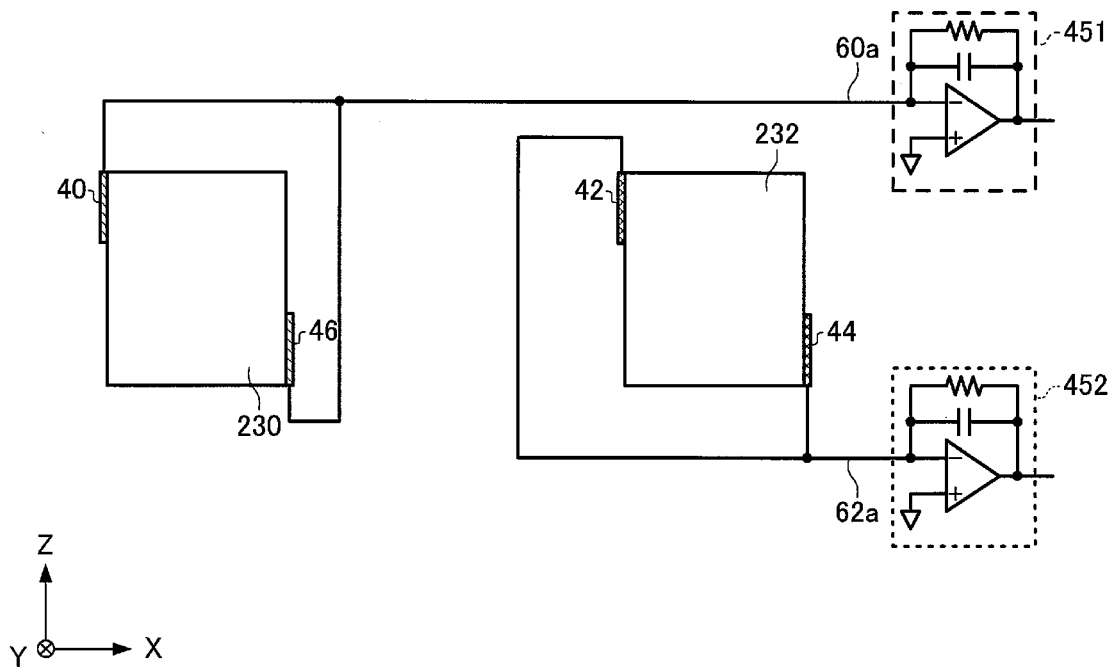
FIG. 26 is a cross-sectional view schematically showing a vibrating element according to a modification example of the present embodiment.

For example, although the first detection electrode 40, the second detection electrode 42, the third detection electrode 44, and the fourth detection electrode 46 are provided in one detection vibration arm or one driving detection vibration arm in the physical quantity detecting device 400 according to each of the embodiments described above, some of the first detection electrode 40, the second detection electrode 42, the third detection electrode 44, and the fourth detection electrode 46 may be provided in one detection vibration arm or one driving detection vibration arm. For example, in the third modification example of the third embodiment, the first and second detection electrodes 40 and 42 may be provided in the second detection vibration arm 232, and the third and fourth detection electrodes 44 and 46 may be provided in the first detection vibration arm 230 as shown in FIG. 25, or the first and fourth detection electrodes 40 and 46 may be provided in the first detection vibration arm 230, and the second and third detection electrodes 42 and 44 may be provided in the second detection vibration arm 232 as shown in FIG. 26.

In addition, for example, the vibrating reed 1 of the vibrating element 100 may be of a comb type or may be of a sound piece type, such as a triangular prism, a quadrangular prism, or a cylindrical shape, as well as the double T type, the H type, the tripod type, and the tuning fork type.

In addition, materials of the vibrating reed 1 are not limited to the single crystal piezoelectric materials, such as crystal ($SiO_2$), lithium tantalate ($LiTaO_3$), and lithium niobate ($LiNbO_3$), and it is possible to use piezoelectric materials including piezoelectric ceramic, such as lead zirconate titanate (PZT).

In addition, the physical quantity detected by the vibrating element 100 may be angular acceleration, acceleration, speed, force, and the like without being limited to the angular velocity. That is, the detection circuit 450 or the physical quantity detecting device 400 may output a signal corresponding to the magnitude of angular acceleration, acceleration, speed, force, and the like without being limited to the angular velocity.

The embodiments and the modification examples described above are just examples, and the invention is not limited to these. For example, each embodiment and each modification example can be appropriately combined.

The invention includes substantially the same configuration (for example, a configuration with the same function, method, and result or a configuration with the same object and effect) as the configuration described in each embodiment. In addition, the invention includes a configuration that replaces a unit that is not essential in the configuration described in the embodiment. In addition, the invention includes a configuration capable of achieving the same operations and effects as in the configuration described in each embodiment or a configuration capable of achieving the same object. In addition, the invention includes a configuration obtained by adding a known technique to the configuration described in the embodiment.

The entire disclosure of Japanese Patent Application No. 2014-060375, filed Mar. 24, 2014 is expressly incorporated by reference herein.

What is claimed is:

1. A physical quantity detecting device, comprising:
    a physical quantity detecting element including a first detection electrode, a second detection electrode, a third detection electrode, and a fourth detection electrode;
    a first current-voltage conversion unit; and
    a second current-voltage conversion unit,
    wherein the first and fourth detection electrodes have the same electrical polarity, the second and third detection electrodes have the same electrical polarity, and the first and second detection electrodes have opposite electrical polarity,
    the first and fourth detection electrodes are connected to the first current-voltage conversion unit, and
    the second and third detection electrodes are connected to the second current-voltage conversion unit.

2. The physical quantity detecting device according to claim 1,
    wherein, in the physical quantity detecting element, a piezoelectric member is provided between the first and second detection electrodes, and a piezoelectric member is provided between the third and fourth detection electrodes.

3. The physical quantity detecting device according to claim 1,
    wherein the physical quantity detecting element includes a driving electrode and a fixed potential wiring line, the fixed potential wiring line being provided between the driving electrode and at least one of the first detection electrode, the second detection electrode, the third detection electrode, and the fourth detection electrode.

4. The physical quantity detecting device according to claim 1,
    wherein the physical quantity detecting element includes first and second vibrating arms, and
    the first and second detection electrodes are provided in the first vibrating arm, and the third and fourth detection electrodes are provided in the second vibrating arm.

5. The physical quantity detecting device according to claim 1,
    wherein the physical quantity detecting element includes a first vibrating arm, and
    the first detection electrode, the second detection electrode, the third detection electrode, and the fourth detection electrode are provided in the first vibrating arm.

6. The physical quantity detecting device according to claim 1,
    wherein the physical quantity detecting element includes a base, first and second connecting arms extending in opposite directions along a first axis from the base, first and second driving vibration arms extending in opposite directions along a second axis perpendicular to the first axis from the first connecting arm, third and fourth driving vibration arms extending in opposite directions along the second axis from the second connecting arm, and first and second detection vibration arms extending in opposite directions along the second axis from the base, and
    the first and second detection electrodes are provided in the first detection vibration arm, and the third and fourth detection electrodes are provided in the second detection vibration arm.

7. The physical quantity detecting device according to claim 1,
    wherein the physical quantity detecting element includes a base, first and second driving vibration arms that are disposed side by side along a first axis and extend along a second axis perpendicular to the first axis from the base, and first and second detection vibration arms that are disposed side by side along the first axis and extend in an opposite direction to the extension direction of the first and second driving vibration arms from the base, and
    the first and second detection electrodes are provided in the first detection vibration arm, and the third and fourth detection electrodes are provided in the second detection vibration arm.

8. The physical quantity detecting device according to claim 1,
    wherein the physical quantity detecting element includes a base and a first driving vibration arm, a second driving vibration arm, and a detection vibration arm that are disposed side by side along a first axis and extend along a second axis perpendicular to the first axis from the base, and
    the first detection electrode, the second detection electrode, the third detection electrode, and the fourth detection electrode are provided in the detection vibration arm.

9. The physical quantity detecting device according to claim 1,
    wherein the physical quantity detecting element includes a base and first and second driving detection vibration arms that are disposed side by side along a first axis and extend along a second axis perpendicular to the first axis from the base, the second detection electrode is provided in the first driving detection vibration arm, and the fourth detection electrode is provided in the second driving detection vibration arm, and a piezoelectric film is provided between the first and second detection electrodes, and a piezoelectric film is provided between the third and fourth detection electrodes.

10. An electronic apparatus comprising the physical quantity detecting device according to claim 1.

11. An electronic apparatus comprising the physical quantity detecting device according to claim 2.

12. An electronic apparatus comprising the physical quantity detecting device according to claim 3.

13. An electronic apparatus comprising the physical quantity detecting device according to claim 4.

14. An electronic apparatus comprising the physical quantity detecting device according to claim 5.

15. A moving object comprising the physical quantity detecting device according to claim 1.

16. A moving object comprising the physical quantity detecting device according to claim 2.

17. A moving object comprising the physical quantity detecting device according to claim 3.

18. A moving object comprising the physical quantity detecting device according to claim 4.

19. A moving object comprising the physical quantity detecting device according to claim 5.

* * * * *